(12) United States Patent
Matsushima et al.

(10) Patent No.: US 11,798,986 B2
(45) Date of Patent: Oct. 24, 2023

(54) SEMICONDUCTOR DEVICE AND CHIP SINGULATION METHOD

(71) Applicant: NUVOTON TECHNOLOGY CORPORATION JAPAN, Kyoto (JP)

(72) Inventors: Yoshihiro Matsushima, Shiga (JP); Yoshihiko Kawakami, Osaka (JP); Shinya Oda, Osaka (JP); Takeshi Harada, Kagoshima (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/399,869

(22) Filed: Aug. 11, 2021

(65) Prior Publication Data

US 2022/0013633 A1  Jan. 13, 2022

Related U.S. Application Data

(63) Continuation of application No. PCT/JP2020/039405, filed on Oct. 20, 2020.

(Continued)

(51) Int. Cl.
*H01L 29/06* (2006.01)
*H01L 21/78* (2006.01)
*H01L 29/78* (2006.01)

(52) U.S. Cl.
CPC ......... *H01L 29/0657* (2013.01); *H01L 21/78* (2013.01); *H01L 29/7813* (2013.01)

(58) Field of Classification Search
CPC .......... H01L 21/78; H01L 29/7813; H01L 2221/68327; H01L 29/78; H01L 21/02076
See application file for complete search history.

(56) References Cited

U.S. PATENT DOCUMENTS 8,835,283 B2    9/2014  Hua
2005/0106782 A1  5/2005  Genda et al.
(Continued)

FOREIGN PATENT DOCUMENTS

CN    110114888 A    8/2019
JP    2002-222852 A   8/2002
(Continued)

OTHER PUBLICATIONS

Japanese Office Action dated Aug. 3, 2021 in the corresponding Japanese Patent Application No. 2021-068886.
(Continued)

*Primary Examiner* — Samuel A Gebremariam
*Assistant Examiner* — Jonas T Beardsley
(74) *Attorney, Agent, or Firm* — McDermott Will & Emery LLP

(57) ABSTRACT

A semiconductor device that is a chip-size-package-type semiconductor device that is facedown mountable includes: a semiconductor layer including a semiconductor substrate and a low-concentration impurity layer in contact with an upper surface of the semiconductor substrate; a metal layer having a thickness of at least 10 μm; a first vertical MOS transistor in the semiconductor layer; and a second vertical MOS transistor in the semiconductor layer. A side surface of the metal layer includes roughness forming vertical stripes in a direction perpendicular to the metal layer, and has a maximum height of profile greater than 1.0 μm. In a plan view of the semiconductor device, an area occupancy of a formation containing metal in the metal layer is at most 5% in a 10-μm square region located at least 13 μm inward from an outer edge of the semiconductor device, within an upper surface of the semiconductor device.

13 Claims, 17 Drawing Sheets

Related U.S. Application Data

(60) Provisional application No. 62/924,013, filed on Oct. 21, 2019.

(56) References Cited

U.S. PATENT DOCUMENTS

| | | | |
|---|---|---|---|
| 2006/0216911 | A1 | 9/2006 | Yoshikawa et al. |
| 2010/0213173 | A1* | 8/2010 | Bailey, III ............. C23G 1/103 216/87 |
| 2015/0357424 | A1* | 12/2015 | Kitao ..................... H01L 29/16 257/334 |
| 2016/0197023 | A1* | 7/2016 | Teshima ............. H01L 23/3185 257/288 |
| 2017/0256464 | A1 | 9/2017 | Naito |
| 2017/0256470 | A1 | 9/2017 | Sakamoto et al. |
| 2019/0319126 | A1 | 10/2019 | Matsushima et al. |
| 2020/0135406 | A1* | 4/2020 | Aburakawa ............ H01G 4/012 |
| 2020/0295128 | A1* | 9/2020 | Minamikawa ...... H01L 29/7397 |
| 2021/0050444 | A1 | 2/2021 | Matsushima et al. |
| 2021/0069926 | A1* | 3/2021 | Fuji ...................... B23K 26/703 |
| 2021/0074844 | A1* | 3/2021 | Kojima ............... H01L 29/7809 |
| 2021/0118738 | A1* | 4/2021 | Sarile ................. H01L 23/3157 |

FOREIGN PATENT DOCUMENTS

| | | |
|---|---|---|
| JP | 2006-120859 A | 5/2006 |
| JP | 2006-269897 A | 10/2006 |
| JP | 4471632 B2 | 6/2010 |
| JP | 2010-267638 A | 11/2010 |
| JP | 2013-003541 A | 1/2013 |
| JP | 2015-095515 A | 5/2015 |
| JP | 2017-162848 A | 9/2017 |
| JP | 2017-162868 A | 9/2017 |
| JP | 2018-078162 A | 5/2018 |
| WO | 2016/203764 A1 | 12/2016 |

OTHER PUBLICATIONS

International Search Report and Written Opinion dated Dec. 28, 2020 in International Application No. PCT/JP2020/039405; with partial English translation.

Chinese Office Action dated Dec. 15, 2021, issued in corresponding Chinese Patent Application No. 202080012688.9; with English translation of the Search Report.

* cited by examiner

<First process>

<Second process>

<Third process>

<Fourth process>

<Fifth process>

<Sixth process>

<Seventh process>

<Eighth process>

FIG. 6A

Maximum height of profile on side
surface of metal layer [μm]

| Dicing method | Laser | | Blade |
|---|---|---|---|
| Sample | Sample 1 | Sample 2 | Sample 3 |
| Side 1 | 2.556 | 1.989 | 0.759 |
| Side 2 | 2.289 | 2.049 | 0.704 |
| Side 3 | 2.507 | 1.703 | 0.826 |
| Side 4 | 2.032 | 2.172 | 0.684 |

FIG. 6B

Maximum height of profile on
undersurface of metal layer [μm]

| Forming method | Plating | |
|---|---|---|
| Sample | Sample 1 | Sample 2 |
| Portion 1 | 4.047 | 7.023 |
| Portion 2 | 3.955 | 4.367 |
| Portion 3 | 3.843 | 7.401 |

<Sixteenth process>

<Seventeenth process>

<Eighteenth process>

<Nineteenth process>

<Twentieth process>

SEMICONDUCTOR DEVICE AND CHIP SINGULATION METHOD

CROSS REFERENCE TO RELATED APPLICATIONS

This is a continuation application of PCT International Application No. PCT/JP2020/039405 filed on Oct. 20, 2020, designating the United States of America, which is based on and claims priority of U.S. Provisional Patent Application No. 62/924,013 filed on Oct. 21, 2019. The entire disclosures of the above-identified applications, including the specifications, drawings and claims are incorporated herein by reference in their entirety.

FIELD

The present disclosure relates to a semiconductor device separated from a wafer and a chip singulation method including dicing a wafer.

BACKGROUND

Conventionally, a semiconductor device separated from a wafer has been known (for example, see Patent Literature (PTL) 1).

CITATION LIST

Patent Literature

PTL 1: WO 2016/203764

SUMMARY

Technical Problem

Conventionally, in the case where a semiconductor device in which a metal layer is formed at a bottom is separated from a wafer, when the metal layer is cut using a laser, a formation is produced by metal once liquefied or vaporized by the heat generated due to irradiation with a laser beam being cooled and solidified again, and the formation adheres to the semiconductor device, which is a known phenomenon.

In the case where such a semiconductor device is incorporated into a product, if a formation that contains metal included in a metal layer falls off the semiconductor device, the formation that has fallen off may cause a short circuit near the semiconductor device.

Thus, the present disclosure has been conceived in view of such problems as described above, and is to provide a semiconductor device that reduces adhesion of a formation that contains metal included in a metal layer.

Solution to Problem

A semiconductor device according to an aspect of the present disclosure is a semiconductor device that is a chip-size-package-type semiconductor device that is facedown mountable, the semiconductor device including: a semiconductor layer that includes: a semiconductor substrate that contains an impurity of a first conductivity type; and a low-concentration impurity layer in contact with an upper surface of the semiconductor substrate, the low-concentration impurity layer containing an impurity of the first conductivity type having a concentration lower than a concentration of the impurity of the semiconductor substrate; a metal layer in contact with an entirety of an undersurface of the semiconductor substrate, the metal layer having a thickness of at least 10 µm; a first vertical metal-oxide semiconductor (MOS) transistor in a first region of the semiconductor layer; a second vertical MOS transistor in a second region of the semiconductor layer, the second region being adjacent to the first region in a plan view of the semiconductor layer; and a protective layer covering at least a portion of an upper surface of the semiconductor layer. The semiconductor substrate functions as a common drain region for the first vertical MOS transistor and the second vertical MOS transistor. A side surface of the metal layer includes roughness that forms vertical stripes extending in a vertical direction that is a direction perpendicular to the metal layer, the roughness having a maximum height of profile greater than 1.0 µm, the maximum height of profile being measured in a lateral direction. In a plan view of the semiconductor device, an area occupancy of a formation containing metal included in the metal layer is at most 5% in a 10-µm square region located at least 13 µm inward from an outer edge of the semiconductor device, the 10-µm square region being included in an upper surface of the semiconductor device.

A chip singulation method according to an aspect of the present disclosure is a chip singulation method including dicing a wafer having an upper surface on which a plurality of semiconductor element structures are formed, the chip singulation method including, in a stated order: a first process of forming a surface supporting layer on the upper surface of the wafer; a second process of thinning the wafer from an undersurface thereof; a third process of removing the surface supporting layer from the upper surface of the wafer; a fourth process of forming a metal layer having a thickness of at least 10 µm on the undersurface of the wafer that has been thinned; a fifth process of applying a dicing tape onto an undersurface of the metal layer; a sixth process of applying, onto the upper surface of the wafer, a process of increasing hydrophilicity of a surface of the wafer; a seventh process of forming a water-soluble protective layer on the surface of the wafer; an eighth process of cutting the metal layer by irradiating a predetermined region of the upper surface of the wafer with a laser beam; and a ninth process of removing the water-soluble protective layer from the surface of the wafer using wash water.

Advantageous Effects

According to the semiconductor device and the chip singulation method according to aspects of the present disclosure, a semiconductor device that reduces adhesion of a formation that contains metal included in a metal layer is provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6A illustrates results of measuring maximum heights of profile of roughness on side surfaces of the metal layer in Embodiment 1.

FIG. 6B illustrates results of measuring maximum heights of profile of roughness on the undersurface of the metal layer in Embodiment 1.

DESCRIPTION OF EMBODIMENTS

Figure 1:
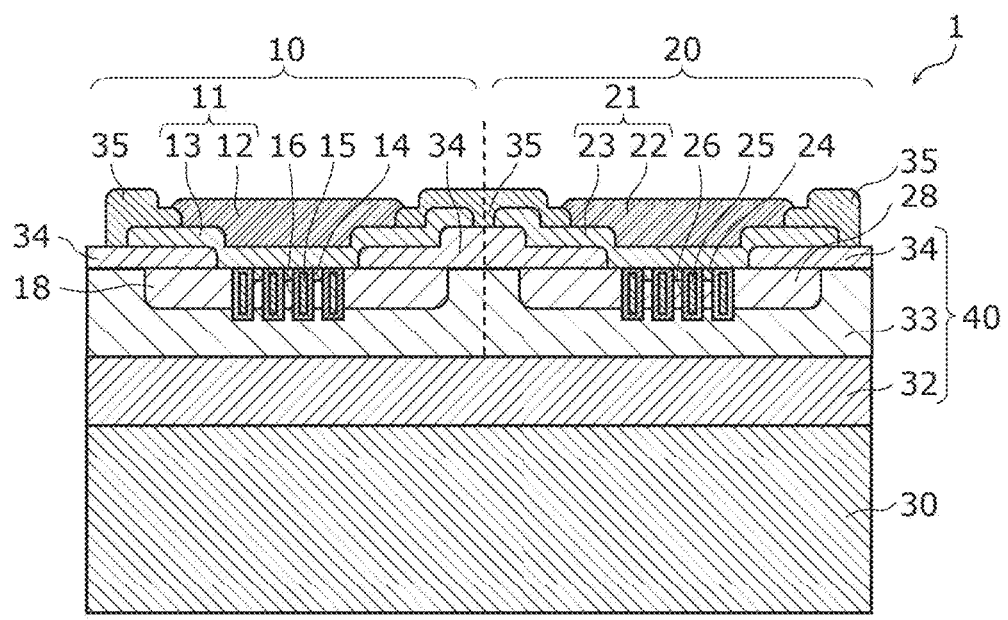
FIG. 1 is a cross-sectional view illustrating an example of a structure of a semiconductor device according to Embodiment 1.

Circumstances that have Led to Aspects of the Present Disclosure

The inventors have repeatedly and diligently conducted experiments and examinations in order to provide a semiconductor device that reduces adhesion of a formation that contains metal included in a metal layer.

The following describes details of the experiments and examinations conducted by the inventors.

When a semiconductor device in which a relatively thick metal layer (having a thickness of at least 10 μm, for example) is formed at a bottom is separated from a wafer, if the metal layer is cut by blade dicing in which a blade is used, metal burrs are generated on and near a cut surface of the metal layer, which is a known phenomenon. For such cutting of a metal layer, metal burrs can be prevented from being generated by cutting the metal layer by laser dicing in which a laser is used.

On the other hand, if the metal layer is cut using a laser, a formation resulting from metal scattered due to irradiation with a laser beam and/or a formation produced by metal once liquefied or vaporized by the heat generated due to irradiation with a laser beam being cooled and solidified again adhere(s) to the semiconductor device, which is a known phenomenon. Accordingly, when a metal layer is cut using a laser, desirably, the surface of a wafer is covered with a water-soluble protective layer before being irradiated with a laser beam so as to avoid adhesion of a formation that contains metal included in the metal layer onto the surface of the wafer. In this case, if the entire surface of the wafer is not covered with such a water-soluble protective layer, a formation that contains metal included in the metal layer may adhere to a portion of the surface of the wafer that is not covered with the water-soluble protective layer.

In general, a process of thinning a wafer is performed by grinding the undersurface of the wafer before a process of forming a metal layer on the undersurface of the wafer. In order to protect the upper surface of the wafer in the thinning process, a process of forming a surface supporting layer on the upper surface of the wafer is performed. The surface supporting layer is removed from the wafer after the thinning process.

Through the experiments and examinations, the inventors have found the cause of adhesion of a formation that contains metal included in a metal layer onto a semiconductor layer lies in a phenomenon that when the surface supporting layer is removed from the upper surface of the wafer, the surface supporting layer partially remains on the surface of the wafer, and the remaining surface supporting layer decreases the hydrophilicity of the surface of the wafer, which prevents the entire surface of the wafer from being covered with a water-soluble protective layer. The inventors further conducted experiments and examinations based on such findings, assuming that if the surface of a wafer is made highly hydrophilic at the start of the process of covering the entire surface of the wafer with a water-soluble protective layer, a semiconductor device that reduces adhesion of a formation that contains metal included in a metal layer can be separated. As a result, the inventors have conceived a chip singulation method and a semiconductor device as will be described below.

A chip singulation method according to an aspect of the present disclosure is a chip singulation method including dicing a wafer having an upper surface on which a plurality of semiconductor element structures are formed, the chip singulation method including, in a stated order: a first process of forming a surface supporting layer on the upper surface of the wafer; a second process of thinning the wafer from an undersurface thereof; a third process of removing the surface supporting layer from the upper surface of the wafer; a fourth process of forming a metal layer having a thickness of at least 10 μm on the undersurface of the wafer that has been thinned; a fifth process of applying a dicing tape onto an undersurface of the metal layer; a sixth process of applying, onto the upper surface of the wafer, a process of increasing hydrophilicity of a surface of the wafer; a seventh process of forming a water-soluble protective layer on the surface of the wafer; an eighth process of cutting the metal layer by irradiating a predetermined region of the upper surface of the wafer with a laser beam; and a ninth process of removing the water-soluble protective layer from the surface of the wafer using wash water.

According to the chip singulation method, the surface of the wafer can be made highly hydrophilic in the sixth process, before the water-soluble protective layer is formed on the surface of the wafer in the seventh process. Accordingly, the entire surface of the wafer can be covered with the water-soluble protective layer in the seventh process. Thus, this reduces adhesion, on the surface of the wafer, of a formation that contains metal included in the metal layer and is formed due to irradiation with a laser beam in the eighth process. Consequently, in the semiconductor device separated by the chip singulation method, adhesion of a formation that contains metal included in the metal layer is reduced.

According to the chip singulation method, a semiconductor device in which adhesion of a formation that contains metal included in a metal layer is reduced is provided.

During a period from when the sixth process ends until when the seventh process starts, the wafer may be stored in an environment in which at most 5000 0.5-μm particles are present per cubic foot, and the seventh process may start before 240 hours elapse after the sixth process ends.

This reduces deterioration in the highly hydrophilic state of the surface of the wafer, which may be caused during a period from when the sixth process ends until when the seventh process starts.

When the seventh process starts, a contact angle that a water droplet forms with the surface of the wafer may be smaller than 60 degrees, the water droplet being formed by placing pure water of 1.77 mm$^3$ with a resistivity ranging from 13.2 MΩ to 17.0 MΩ onto the surface of the wafer.

Accordingly, it can be more ensured that the water-soluble protective layer is formed in the seventh process.

The ninth process may include in a stated order: a first washing process of using the wash water having a first water pressure; and a second washing process of using the wash water having a second water pressure. The first water pressure may be at least 50 bar, and may be higher than the second water pressure, and a time for the first washing process may range from at least 40 seconds to at most 100 seconds.

Accordingly, this improves accuracy of removal of a formation that contains metal included in the metal layer, which is conducted together with the removal of the water-soluble protective layer in the ninth process.

In the first washing process, the wafer may be rotated at a first rotational speed. In the second washing process, the wafer may be rotated at a second rotational speed lower than or equal to the first rotational speed, and the ninth process may further include, between the first washing process and the second washing process, a drying process of rotating the wafer at a third rotational speed higher than the first rotational speed.

Accordingly, this further improves accuracy of removal of a formation that contains metal included in the metal layer, which is conducted together with the removal of the water-soluble protective layer in the ninth process.

The chip singulation method may further include: a tenth process of forming a groove in a region of the upper surface of the wafer between adjacent ones of the plurality of semiconductor element structures, in a period from when the fifth process ends until when the sixth process starts.

Accordingly, a process of increasing hydrophilicity can be performed in the sixth process on the surface of the groove formed in the tenth process.

In a plan view of the wafer, the predetermined region may be included in an inner region of the groove, and a shortest distance between the predetermined region and an edge of the groove may be at least 14 μm.

Accordingly, this reduces damage, which is caused by irradiation with a laser beam in the eighth process, onto the water-soluble protective layer on the surface of the groove formed in the tenth process.

The process of increasing the hydrophilicity may be plasma cleaning performed on the surface of the wafer.

Accordingly, a process of increasing hydrophilicity can be relatively readily performed.

A semiconductor device according to an aspect of the present disclosure is a semiconductor device that is a chip-size-package-type semiconductor device that is facedown mountable, the semiconductor device including: a semiconductor layer that includes: a semiconductor substrate that contains an impurity of a first conductivity type; and a low-concentration impurity layer in contact with an upper surface of the semiconductor substrate, the low-concentration impurity layer containing an impurity of the first conductivity type having a concentration lower than a concentration of the impurity of the semiconductor substrate; a metal layer in contact with an entirety of an undersurface of the semiconductor substrate, the metal layer having a thickness of at least 10 μm; a first vertical metal-oxide semiconductor (MOS) transistor in a first region of the semiconductor layer; a second vertical MOS transistor in a second region of the semiconductor layer, the second region being adjacent to the first region in a plan view of the semiconductor layer; and a protective layer covering at least a portion of an upper surface of the semiconductor layer. The semiconductor substrate functions as a common drain region for the first vertical MOS transistor and the second vertical MOS transistor. A side surface of the metal layer includes roughness that forms vertical stripes extending in a vertical direction that is a direction perpendicular to the metal layer, the roughness having a maximum height of profile greater than 1.0 μm, the maximum height of profile being measured in a lateral direction. In a plan view of the semiconductor device, an area occupancy of a formation containing metal included in the metal layer is at most 5% in a 10-μm square region located at least 13 μm inward from an outer edge of the semiconductor device, the 10-μm square region being included in an upper surface of the semiconductor device.

In the semiconductor device, adhesion of a formation that contains metal included in the metal layer is reduced. Thus, as shown by the semiconductor device, a semiconductor device in which adhesion of a formation that contains metal is reduced is provided.

In the plan view of the semiconductor device, a distance between the outer edge of the semiconductor device and an outer edge of an uppermost surface of the semiconductor layer may be shorter than 14 μm, and in the plan view of the semiconductor device, an area occupancy of the formation may be at most 5% in a 10-μm square region located at least 5 μm inward from the outer edge of the semiconductor device, the 10-μm square region being included in the upper surface of the semiconductor device.

Accordingly, adhesion of a formation that contains metal can be further reduced.

The semiconductor layer may include a curved step portion in a region extending inward of the semiconductor layer from an outer edge of the semiconductor layer, in the plan view of the semiconductor layer, and an area occupancy of the formation may be at most 5% in a 10-μm square region above a highest position of the formation, the 10-μm square region being included in a surface of the curved step portion, the formation being physically connected to the metal layer.

The semiconductor layer may include a curved step portion in a region extending inward of the semiconductor layer from an outer edge of the semiconductor layer, in the plan view of the semiconductor layer, and in the plan view of the semiconductor device, a distance between the outer edge of the semiconductor device and an outer edge of an uppermost surface of the semiconductor layer may be at least 14 μm.

In the plan view of the semiconductor device, in the upper surface of the semiconductor device, a region at least 8 μm and at most 13 μm apart from the outer edge of the semiconductor device may include a 5-μm square region in which an area occupancy of the formation is at most 5%.

In the plan view of the semiconductor device, the formation may be present in a region that extends at most 13 μm inward from the outer edge of the semiconductor device, the formation covering a portion of the upper surface of the semiconductor layer and being physically connected to the metal layer.

A highest position of the formation is at a height of at most 10 μm above an outer edge of the semiconductor layer in the plan view of the semiconductor layer, the formation being physically connected to the metal layer.

The semiconductor layer may include a curved step portion in a region extending inward of the semiconductor layer from an outer edge of the semiconductor layer, in the plan view of the semiconductor layer, and in a surface of the curved step portion, a region at a height of at least 5 μm and at most 10 μm above the outer edge of the semiconductor layer in the plan view of the semiconductor layer may include a 5-μm square region in which an area occupancy of the formation is at most 5%.

A mass concentration of carbon atoms on an uppermost surface of the semiconductor device out of surfaces of the semiconductor device may be lower than 18%.

A mass concentration of carbon atoms on an uppermost surface of the semiconductor device out of surfaces of the semiconductor device may be lower than four times a mass concentration of carbon atoms on a side surface of the metal layer.

The semiconductor layer may include a curved step portion in a region extending inward of the semiconductor layer from an outer edge of the semiconductor layer, in the plan view of the semiconductor layer, and a mass concentration of carbon atoms on a surface of the curved step portion may be lower than 18%.

The semiconductor layer may include a curved step portion in a region extending inward of the semiconductor layer from an outer edge of the semiconductor layer, in the plan view of the semiconductor layer, and a mass concentration of carbon atoms on a surface of the curved step portion may be lower than four times a mass concentration of carbon atoms on the side surface of the metal layer.

The maximum height of profile of the roughness measured in the lateral direction may be at most a maximum height of profile of roughness on an undersurface of the metal layer measured in a direction parallel to the undersurface of the metal layer.

Hp/Ls<1 may be satisfied, where Hp denotes a height from an uppermost surface of the semiconductor layer to an uppermost surface of the protective layer, and Ls denotes a length from an outer edge of an uppermost surface of the semiconductor layer to an outer edge of a lowermost surface of the protective layer in the plan view of the semiconductor device.

The following describes specific examples of a semiconductor device and a chip singulation method according to aspects of the present disclosure with reference to the drawings. Embodiments described herein are specific examples of the present disclosure. The numerical values, shapes, elements, the arrangement and connection of the elements, steps (processes), and the processing order of the steps, for instance, described in the following embodiments are mere examples, and thus are not intended to limit the scope of the present disclosure. The drawings are schematic diagrams and do not necessarily give strict illustration. Throughout the drawings, the same numeral is given to substantially the same element, and redundant description is omitted or simplified.

Embodiment 1

[1-1. Structure of Semiconductor Device]

The following describes a structure of a semiconductor device according to Embodiment 1. The semiconductor device according to Embodiment 1 is a chip-size-package-type (CSP) semiconductor device that is facedown mountable, and in which two vertical metal oxide semiconductor (MOS) transistors are formed. The two vertical MOS transistors are power transistors, and are so-called trench metal oxide semiconductor field effect transistors (MOSFETs).

Figure 2:
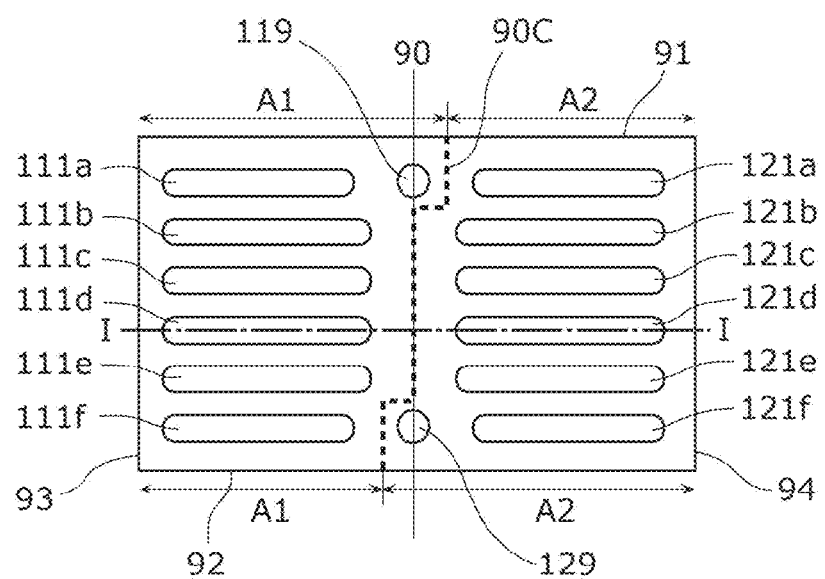
FIG. 2 is a plan view illustrating an example of a structure of the semiconductor device according to Embodiment 1.

FIG. 1 is a cross-sectional view illustrating an example of a structure of semiconductor device 1 according to Embodiment 1. FIG. 2 is a plan view illustrating an example of a configuration of semiconductor device 1. FIG. 1 illustrates a cross section taken along I-I in FIG. 2.

As illustrated in FIG. 1 and FIG. 2, semiconductor device includes semiconductor layer 40, metal layer 30, first vertical MOS transistor 10 (hereinafter, also referred to as "transistor 10") formed in first region A1 of semiconductor layer 40, and second vertical MOS transistor 20 (hereinafter, also referred to as "transistor 20") formed in second region A2 of semiconductor layer 40. Here, as illustrated in FIG. 2, first region A1 and second region A2 are adjacent to each other in a plan view of semiconductor layer 40.

Semiconductor layer 40 has a configuration in which semiconductor substrate 32, low-concentration impurity layer 33, and oxide film 34 are stacked.

Semiconductor substrate 32 is disposed at a bottom portion of semiconductor layer 40, and includes silicon that contains an impurity of a first conductivity type.

Low-concentration impurity layer 33 is dispose in an upper portion of semiconductor layer 40, is formed in contact with semiconductor substrate 32, and contains an impurity of the first conductivity type having a lower concentration than the concentration of the impurity of the first conductivity type of semiconductor substrate 32. Low-concentration impurity layer 33 is formed on semiconductor substrate 32 by epitaxial growth, for example.

Oxide film 34 is disposed at an uppermost portion of semiconductor layer 40, being formed in contact with low-concentration impurity layer 33.

Protective layer 35 is formed in contact with the upper surface of semiconductor layer 40, and covers at least a portion of the upper surface of semiconductor layer 40.

Metal layer 30 is formed in contact with the entire undersurface of semiconductor substrate 32. Note that metal layer 30 may contain a trace element that mixes as an impurity, other than metal, in a manufacturing process of a metal material.

As illustrated in FIG. 1 and FIG. 2, transistor 10 includes, on the upper surface of semiconductor layer 40, one or more (here, six) first source pads 111 (first source pads 111a, 111b, 111c, 111d, 111e, and 111f) and first gate pad 119, which are bonded to a mounting substrate via a bonding material, when semiconductor device 1 is mounted facedown. Further, transistor 20 includes, on the upper surface of semiconductor layer 40, one or more (here, six) second source pads 121 (second source pads 121a, 121b, 121c, 121d, 121e, and 121f) and second gate pad 129, which are bonded to a mounting substrate via a bonding material, when semiconductor device 1 is mounted facedown.

As illustrated in FIG. 1 and FIG. 2, semiconductor layer 40 is quadrilateral, and transistor 10 and transistor 20 are arranged in a first direction in a plan view. Here, semiconductor layer 40 has a rectangular shape having one long side 91 and another long side 92 parallel to the first direction, and one short side 93 and another short side 94 perpendicular to the first direction. Thus, semiconductor layer 40 has a rectangular shape having the long sides extending in the first direction, herein.

In FIG. 2, center line 90 bisects rectangular semiconductor layer 40 in the first direction, in the plan view of semiconductor layer 40. Accordingly, center line 90 is a straight line extending in a direction perpendicular to the first direction in the plan view of semiconductor layer 40.

Boundary 90C is between first region A1 and second region A2. In the plan view of semiconductor layer 40, boundary 90C bisects the surface area of semiconductor layer 40, yet is not necessarily a straight line. In the plan view of semiconductor layer 40, center line 90 may or may not coincide with boundary 90C.

Note that the number of first gate pads 119 and the number of second gate pads 129 are not each necessarily limited to one as illustrated in FIG. 2.

Note that the number of one or more first source pads 111 and the number of one or more second source pads 121 are not each necessarily limited to six as illustrated in FIG. 2, and may each be at least one except six.

As illustrated in FIG. 1 and FIG. 2, first body region 18 that contains an impurity of a second conductivity type different from the first conductivity type is formed in first region A1 of low-concentration impurity layer 33. In first body region 18, first source region 14 that contains an impurity of the first conductivity type, first gate conductor 15, and first gate insulating film 16 are formed. First source electrode 11 includes portion 12 and portion 13, and portion 12 is connected to first source region 14 and first body region 18 via portion 13. First gate conductor 15 is electrically connected to first gate pad 119.

Portion 12 of first source electrode 11 is a layer bonded by reflow soldering when semiconductor device 1 is mounted facedown, and may include, as a non-limiting example, a metal material that contains at least one of nickel, titanium, tungsten, or palladium. The upper surface of portion 12 may be plated with gold, for instance.

Portion 13 of first source electrode 11 is a layer that connects portion 12 to semiconductor layer 40, and may include, as a non-limiting example, a metal material that contains at least one of aluminum, copper, gold, or silver.

Second body region 28 that contains an impurity of the second conductivity type is formed in second region A2 of low-concentration impurity layer 33. In second body region 28, second source region 24 that contains an impurity of the first conductivity type, second gate conductor 25, and second gate insulating film 26 are formed. Second source electrode 21 includes portion 22 and portion 23, and portion 22 is connected to second source region 24 and second body region 28 via portion 23. Second gate conductor 25 is electrically connected to second gate pad 129.

Portion 22 of second source electrode 21 is a layer bonded by reflow soldering when semiconductor device 1 is mounted facedown, and may include, as a non-limiting example, a metal material that contains at least one of nickel, titanium, tungsten, or palladium. The upper surface of portion 22 may be plated with gold, for instance.

Portion 23 of second source electrode 21 is a layer that connects portion 22 to semiconductor layer 40, and may include, as a non-limiting example, a metal material that contains at least one of aluminum, copper, gold, or silver.

The above configuration of transistor 10 and transistor 20 allows low-concentration impurity layer 33 and semiconductor substrate 32 to function as a common drain region that is used as both a first drain region of transistor 10 and a second drain region of transistor 20.

As illustrated in FIG. 1, first body region 18 is covered with oxide film 34 having an opening, and portion 13 of first source electrode 11, which is connected to first source region 14 via the opening of oxide film 34, is provided. Oxide film 34 and portion 13 of first source electrode 11 are covered with protective layer 35 having an opening, and portion 12 connected to portion 13 of first source electrode 11 via the opening of protective layer 35 is provided.

Second body region 28 is covered with oxide film 34 having an opening, and portion 23 of second source electrode 21, which is connected to second source region 24 via the opening of oxide film 34, is provided. Oxide film 34 and portion 23 of second source electrode 21 are covered with protective layer 35 having an opening, and portion 22 connected to portion 23 of second source electrode 21 via the opening of protective layer 35 is provided.

Thus, one or more first source pads 111 and one or more second source pads 121 indicate regions of first source electrode 11 and second source electrode 21, respectively, which are partially exposed from the upper surface of semiconductor device 1, that is, so-called terminal portions. Similarly, first gate pad 119 and second gate pad 129 indicate regions of first gate electrode 19 (not illustrated in FIG. 1 or FIG. 2) and second gate electrode 29 (not illustrated in FIG. 1 or FIG. 2), respectively, which are partially exposed from the upper surface of semiconductor device 1, that is, so-called terminal portions. In the Specification, "electrode pad" is a generic term for source pads and gate pads.

Further, the thickness of semiconductor layer 40 ranges from 10 μm to 90 μm, the thickness of metal layer 30 ranges from 10 μm to 90 μm, and a sum of the thicknesses of oxide film 34 and protective layer 35 ranges from 3 μm to 13 μm, as examples of typical designs for structures in semiconductor device 1.

[1-2. Chip Singulation Method for Separating Semiconductor Device]

Semiconductor device 1 is obtained by dicing a wafer on which a plurality of semiconductor element structures are formed.

Here, chip singulation (separating from a wafer) means cutting a wafer and separating a plurality of semiconductor element structures formed on the wafer in an array into individual structures.

The following describes a first chip singulation method for separating semiconductor device 1 from a wafer.

The first chip singulation method is performed on a wafer on which a plurality of semiconductor element structures are formed in an array. The first chip singulation method includes a plurality of processes.

Figure 3A:
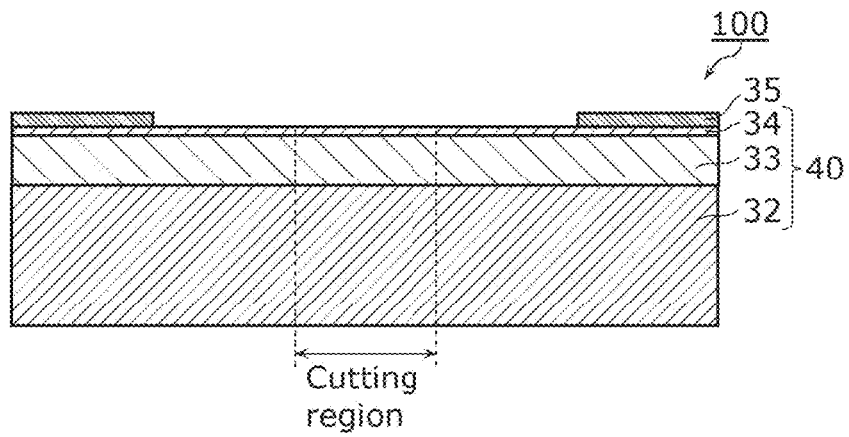
FIG. 3A is a schematic enlarged cross-sectional view of a wafer in Embodiment 1.

FIG. 3A is a schematic enlarged cross-sectional view of a cutting region and therearound of wafer 100 when the first chip singulation method is to be started, and FIG. 3B to FIG. 3J are schematic enlarged cross-sectional views of the cutting region and therearound of wafer 100 in the processes performed in the first chip singulation method.

As illustrated in FIG. 3B to FIG. 3J, the first chip singulation method includes a first process to a ninth process in the order.

Figure 3B:
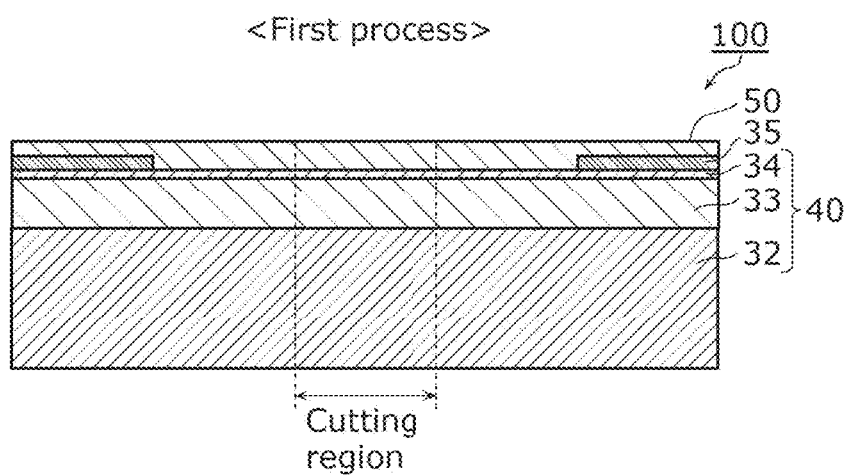
FIG. 3B is a schematic enlarged cross-sectional view of the wafer in Embodiment 1.

As illustrated in FIG. 3B, the first process is a process for forming surface supporting layer 50 on the upper surface of wafer 100. The first process is performed to prevent the surface of wafer 100 from being damaged or becoming unclean, for instance, due to a foreign substance that may be generated in a second process described later.

Surface supporting layer 50 may be a backgrinding tape, for example. If surface supporting layer 50 is a backgrinding tape, the first process is performed by applying the backgrinding tape onto the upper surface of wafer 100, for example. The backgrinding tape may be an adhesive tape that includes an ethylene-vinyl acetate copolymer as a surface base material, and an acrylic resin as an adhesive layer, for example.

Figure 3C:
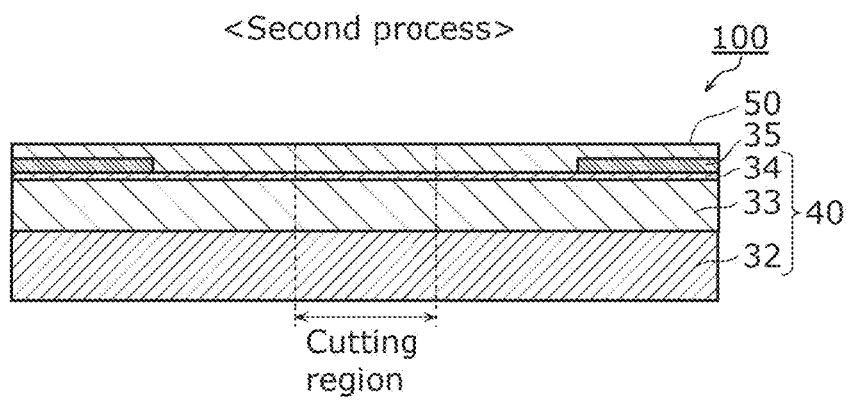
FIG. 3C is a schematic enlarged cross-sectional view of the wafer in Embodiment 1.

As illustrated in FIG. 3C, the second process is a process of thinning wafer 100 from the undersurface thereof.

The second process is performed by grinding the undersurface of wafer 100, for example. In general, a process of grinding the undersurface of a wafer is also referred to as backgrinding. Thus, stated differently, the second process is performed by backgrinding on the undersurface of wafer 100, for example.

Figure 3D:
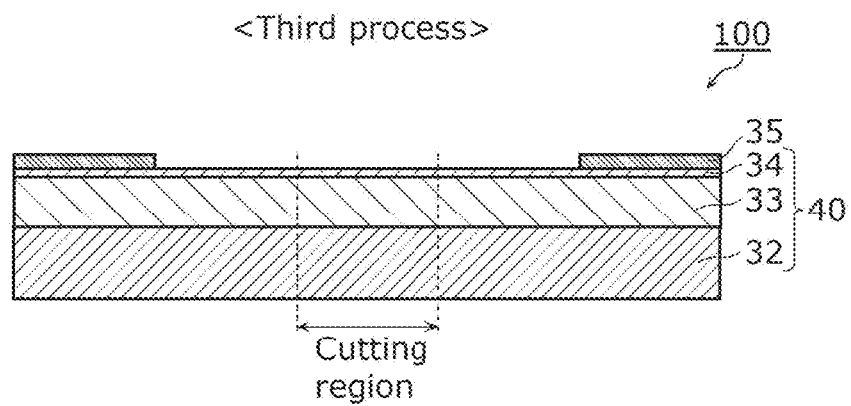
FIG. 3D is a schematic enlarged cross-sectional view of the wafer in Embodiment 1.

As illustrated in FIG. 3D, a third process is a process of removing, from the upper surface of wafer 100, surface supporting layer 50 formed on the upper surface of wafer 100 in the first process.

If surface supporting layer 50 is a backgrinding tape, the third process is performed by removing the applied backgrinding tape from the upper surface of wafer 100, for example.

It is difficult to completely remove surface supporting layer 50 formed on the upper surface of wafer 100 in the third process.

Figure 3E:
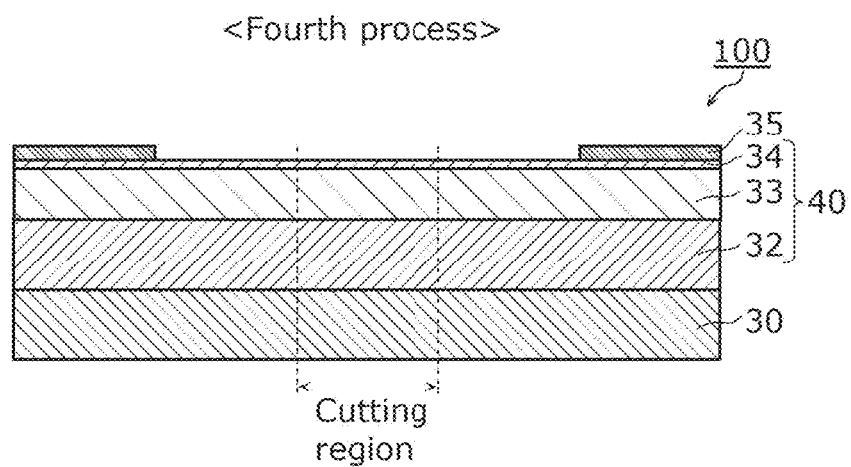
FIG. 3E is a schematic enlarged cross-sectional view of the wafer in Embodiment 1.

As illustrated in FIG. 3E, a fourth process is a process of forming metal layer 30 having a thickness of at least 10 µm on the undersurface of wafer 100 that has been thinned in the second process.

Metal layer 30 may include a single metal or may include an alloy of a plurality of metals, for example. Furthermore, metal layer 30 may include a single layer including a single metal or an alloy, or a stack of a plurality of layers each including a different metal or alloy.

The fourth process may be performed, for example, by depositing metal onto the undersurface of wafer 100, by plating the undersurface of wafer 100 with metal, or by depositing metal onto the undersurface of wafer 100 and thereafter plating the undersurface of wafer 100 with the same or different metal.

Figure 4:
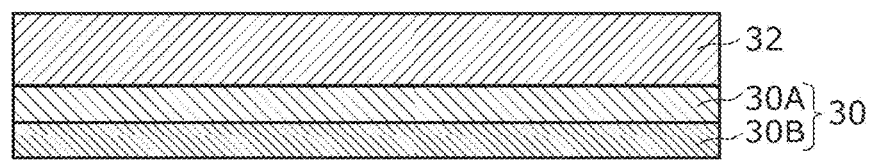
FIG. 4 is a cross-sectional view illustrating an example of a structure of a metal layer in Embodiment 1.

FIG. 4 is a cross-sectional view illustrating an example of a structure of metal layer 30.

As illustrated in FIG. 4, metal layer 30 includes a stack of first metal layer 30A adjacent to semiconductor substrate 32 and second metal layer 30B on the opposite side, for example. First metal layer 30A may be formed by, for example, silver plating and have a thickness of at least 10 µm and at most 40 µm, and second metal layer 30B may be formed by, for example, nickel plating and have a thickness smaller than 40 µm.

Figure 3F:
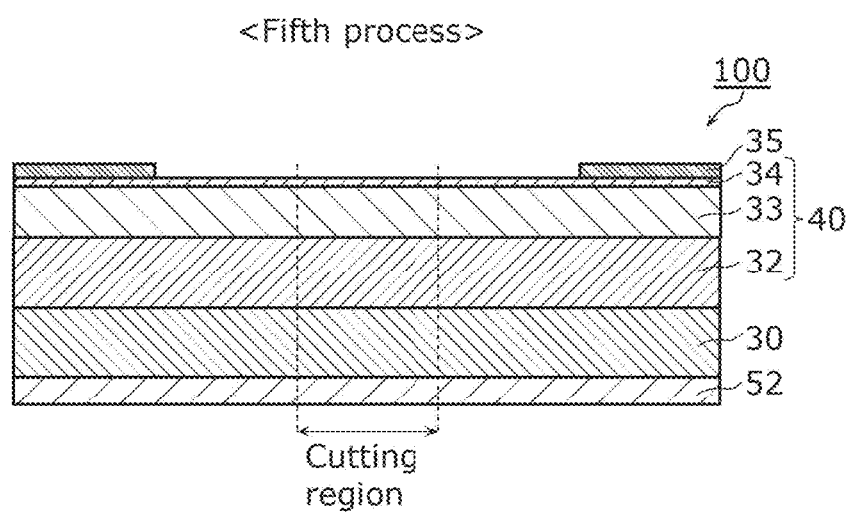
FIG. 3F is a schematic enlarged cross-sectional view of the wafer in Embodiment 1.

As illustrated in FIG. 3F, a fifth process is a process of applying dicing tape 52 onto the undersurface of metal layer 30 formed in the fourth process. Dicing tape 52 may be, for example, an adhesive tape that includes a polyolefin, an acrylic urethane resin, or an acrylic acid ester copolymer, for instance, as a base material.

Figure 3G:
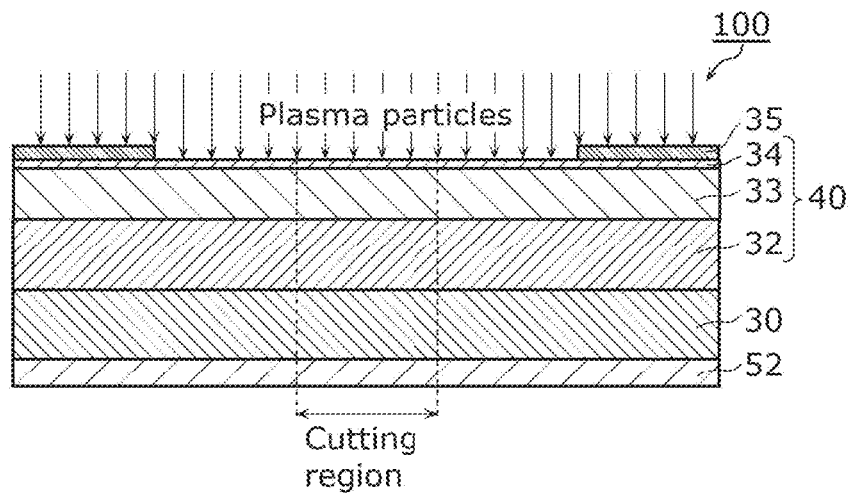
FIG. 3G is a schematic enlarged cross-sectional view of the wafer in Embodiment 1.

As illustrated in FIG. 3G, a sixth process is a process of increasing hydrophilicity of the surface of wafer 100, which is performed on the upper surface of wafer 100.

The process of increasing hydrophilicity is a process of removing residual surface supporting layer 50 remaining due to not being completely removed from the surface of wafer 100 in the third process, and may be a plasma treatment for dry cleaning using, for example, plasma, an organic solvent cleaning treatment for wet cleaning using an appropriate organic solvent such as, for example, acetone, an ultraviolet (UV) irradiation treatment, for example, or an ashing treatment.

Here, the process of increasing hydrophilicity is, for example, a plasma treatment using atmospheric pressure plasma technology in which argon and/or oxygen are the material.

The sixth process is a process of covering the entire surface of wafer 100 with water-soluble protective layer 51 (see FIG. 3H) in a seventh process described later, by making the surface of wafer 100 relatively highly hydrophilic.

As described above, it is difficult to completely remove surface supporting layer 50 formed on the upper surface of wafer 100 in the third process. If surface supporting layer 50 is not completely removed from the surface of wafer 100 and remains thereon, residual surface supporting layer 50 decreases the hydrophilicity of the surface of wafer 100. Accordingly, before a seventh process starts, the sixth process is performed so as to make the surface of wafer 100 relatively highly hydrophilic.

Conversely, if the sixth process is not performed prior to the seventh process, hydrophilicity of the surface of wafer 100 is decreased in the third process, and thus, the entire surface of wafer 100 cannot be covered with water-soluble protective layer 51 in the seventh process.

The entire surface of wafer 100 is covered with water-soluble protective layer 51 in the seventh process, and thus a formation that contains metal included in metal layer 30 and is formed due to irradiation with a laser beam in an eighth process described later can be prevented from adhering to the surface of the wafer.

Figure 3H:
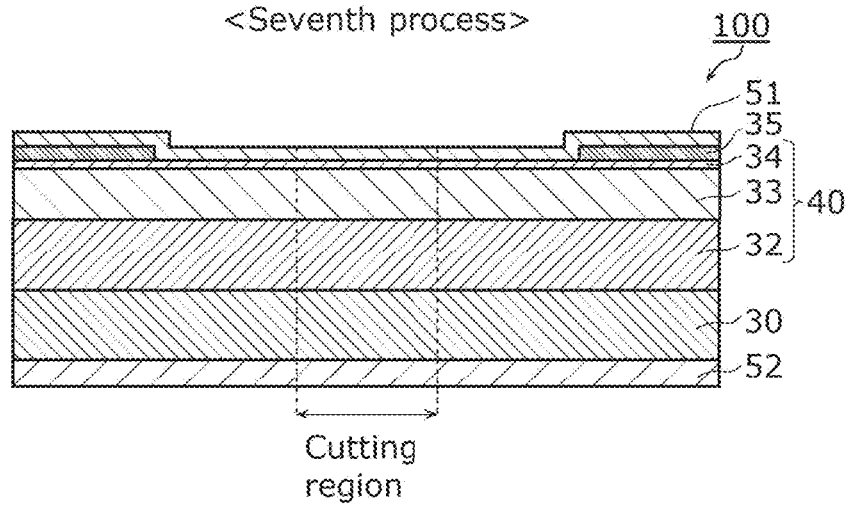
FIG. 3H is a schematic enlarged cross-sectional view of the wafer in Embodiment 1.

As illustrated in FIG. 3H, the seventh process is a process of forming water-soluble protective layer 51 on the surface of wafer 100.

Water-soluble protective layer 51 is formed on the surface of wafer 100 by applying, onto the surface of wafer 100, a coating that forms water-soluble protective layer 51 using a spin coater, for example.

A coating, that is, water-soluble protective layer 51 may include, for example, 1-methoxy-2-propanol, monopropylene glycol methyl ether.

The spin coater applies a coating by dripping a coating of less than 100 ml onto the surface of wafer 100 while rotating wafer 100 at a rotation speed higher than 500 rpm.

The inventors have repeatedly and diligently conducted experiments and examinations regarding conditions of the state of the surface of wafer 100, which allow the entire surface of wafer 100 to be covered with water-soluble protective layer 51 in the seventh process.

As a result, the inventors have found that the entire surface of wafer 100 can be covered with water-soluble protective layer 51 if a contact angle that a water droplet forms with the surface of wafer 100 is smaller than 60 degrees when the seventh process is to be started. Note that the water droplet is formed by placing pure water of 1.77 mm$^3$ with a resistivity ranging from 13.2 MΩ to 17.0 MΩ onto the surface of wafer 100 using a technique of slowly bringing a water droplet formed at the tip of a needle close to and into contact with the surface of wafer 100 and away therefrom.

The contact angle is obtained by observing a water droplet and measuring an angle that the water droplet forms with the surface of wafer 100, while the direction of a line of sight coincides with the surface of wafer 100.

In general, according to the environment in which and a length of a period for which wafer 100 is stored, hydrophilicity of the surface of wafer 100 is gradually lost during a period from when the process of increasing hydrophilicity of the surface of wafer 100 is applied onto the upper surface of wafer 100 in the sixth process until when the seventh process starts.

Accordingly, the inventors have repeatedly and diligently conducted experiments and examinations regarding a method of storing wafer 100 during a period from when the sixth process ends until when the seventh process starts.

As a result, the inventors have found that in order to satisfy such conditions for the state of the surface of wafer 100, desirably, wafer 100 is stored in an environment in which at most 5000 0.5-μm particles are present per cubic foot during a period from when the sixth process ends until when the seventh process starts, and the seventh process starts before 240 hours elapse after the sixth process ends.

Figure 3I:
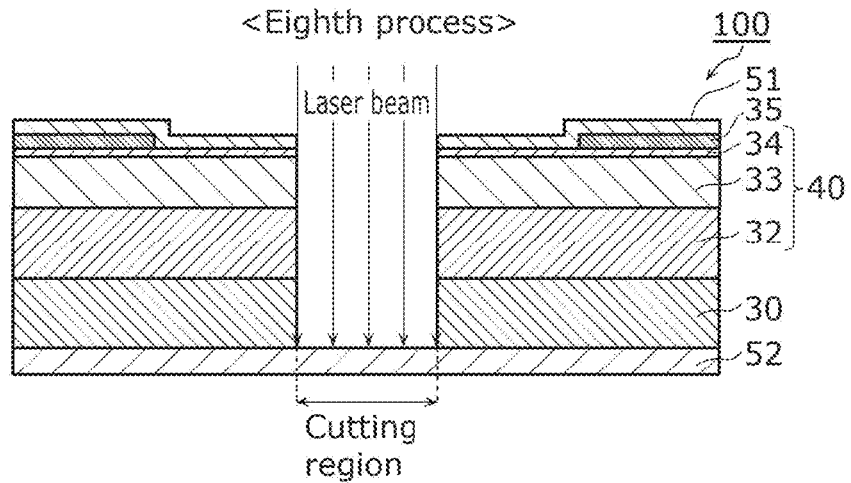
FIG. 3I is a schematic enlarged cross-sectional view of the wafer in Embodiment 1.

As illustrated in FIG. 3I, the eighth process is a process of cutting metal layer 30 by irradiating a cutting region that is a predetermined region of wafer 100 with a laser beam. A laser that emits a laser beam may be a Q-switch laser that emits a laser beam having a wavelength of 355 nm.

In the eighth process, in a plan view of wafer 100, the distance between an edge of the cutting region and the outer edge of the uppermost surface of semiconductor layer 40 is shorter than 14 μm. Accordingly, in a plan view of semiconductor device 1 separated by the first chip singulation method, the distance between the outer edge of semiconductor device 1 and the outer edge of the uppermost surface of semiconductor layer 40 is shorter than 14 μm. At this time, Hp/Ls<0.4, where Hp denotes the height from the uppermost surface of semiconductor layer 40 to the uppermost surface of protective layer 35, and Ls denotes the length from the outer edge of the uppermost surface of semiconductor layer 40 to the outer edge of the lowermost surface of protective layer 35 in the plan view of wafer 100, that is, in the plan view of semiconductor device 1. Thus, Hp/Ls<0.4 in semiconductor device 1 separated by the first chip singulation method. According to such a configuration, the uppermost surface of semiconductor device 1 is favorably flat, and water-soluble protective layer 51 is further readily formed in the seventh process.

Figure 5:
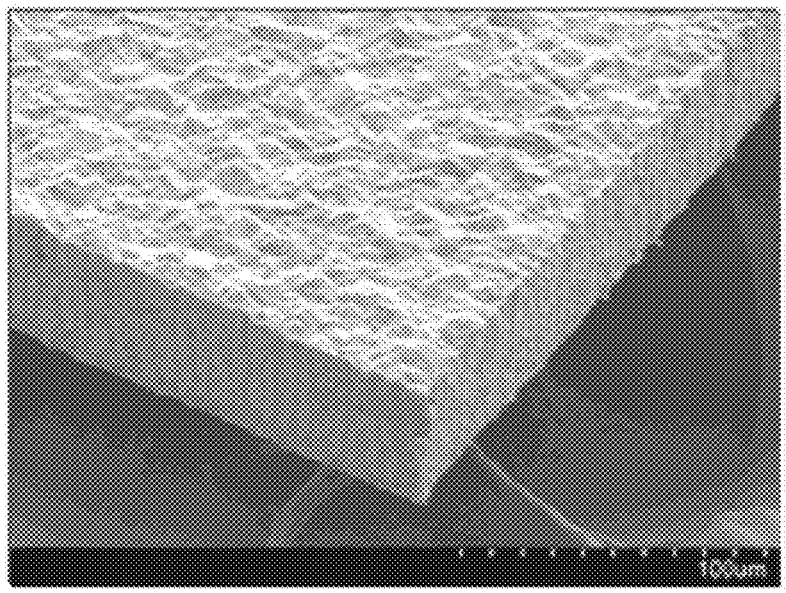
FIG. 5 is an oblique image of cut surfaces of the metal layer in Embodiment 1 captured from the undersurface side of the metal layer.

If metal layer 30 is cut by being irradiated with a laser beam, a mark resulting from being cut by laser irradiation is formed in the cross section of metal layer 30. Specifically, roughness is formed that has a maximum height of profile greater than 1.0 μm and forms vertical stripes extending in a vertical direction, which is a direction perpendicular to metal layer 30 and in which a laser beam is emitted. Accordingly, in semiconductor device 1 separated by the first chip singulation method, a side surface of metal layer 30 has roughness that has a maximum height of profile greater than 1.0 μm, and forms vertical stripes extending in the vertical direction that is a direction perpendicular to metal layer 30. Note that cut surfaces of metal layer 30 are recognized to have substantially vertical stripes formed in appearance as shown in FIG. 5 described later, and thus not necessarily only vertical stripes in a strict sense are formed. Further, the direction perpendicular to metal layer 30 is defined as a vertical direction, and the maximum height of profile of roughness stated above indicates a numerical value measured in a lateral direction that is substantially perpendicular to the vertical direction.

FIG. 5 is an oblique image of cut surfaces of metal layer 30 captured from the undersurface side when metal layer 30 is cut by being irradiated with a laser beam.

As shown in FIG. 5, cutting metal layer 30 by irradiation with a laser beam forms, on the cut surfaces of metal layer 30, roughness that has a maximum height of profile greater than 1.0 μm, and forms vertical stripes extending in the vertical direction which is a direction perpendicular to metal layer 30 and in which the laser beam is emitted.

FIG. 6A illustrates results of measuring maximum heights of profile of roughness on side surfaces of metal layer 30.

In FIG. 6A, the maximum height of profile of roughness on a side surface of metal layer 30 indicates a maximum height of profile of roughness on the side surface of metal layer 30 measured in the lateral direction when the direction perpendicular to metal layer 30 is the vertical direction. Stated differently, the maximum height of profile indicates a maximum height of profile of the above-stated roughness measured in the lateral direction.

As can be seen from FIG. 6A, when metal layer 30 is cut by a laser dicing method in which a laser is used, a maximum height of profile of roughness on a side surface of metal layer 30 is at least 1.0 μm, whereas when metal layer 30 is cut by a blade dicing method in which a blade is used, a maximum height of profile of roughness on a side surface of metal layer 30 is at most 1.0 μm.

As shown in FIG. 5, if the entire side surface of metal layer 30 is recognized to have substantially vertical stripes in appearance, it can be seen that metal layer 30 is cut by the laser dicing method.

Furthermore, the side surfaces of metal layer 30 cut by being irradiated with a laser beam are as smooth as or smoother than the undersurface of metal layer 30 formed in the fourth process.

FIG. 6B illustrates results of measuring maximum heights of profile of roughness on the undersurface of metal layer 30.

In FIG. 6B, the maximum height of profile of roughness on the undersurface of metal layer 30 indicates a maximum height of profile measured in a direction parallel to the undersurface of metal layer 30.

As can be seen from FIG. 6A and FIG. 6B, when metal layer 30 is cut by the laser dicing method in which a laser is used, the maximum height of profile of the roughness on a side surface of metal layer 30 measured in the lateral direction is at most the maximum height of profile of roughness on the undersurface of metal layer 30 measured in a direction parallel to the undersurface. Stated differently, in semiconductor device 1 separated by the first chip singulation method, the maximum height of profile of the roughness measured in the lateral direction is at most the maximum height of profile of roughness on the undersurface of metal layer 30 measured in a direction parallel to the undersurface.

As shown in FIG. 5, if metal layer 30 is cut by being irradiated with a laser beam, the maximum height of profile of the roughness measured in the lateral direction is at most the maximum height of profile of roughness on the undersurface of metal layer 30 measured in a direction parallel to the undersurface.

In the eighth process, when metal layer 30 is cut by being irradiated with a laser beam, a phenomenon that formations that contain metal included in metal layer 30 are scattered, and a phenomenon that a formation is formed by metal that once liquefied or vaporized due to heat from irradiation with a laser beam being cooled again and hardened.

Figure 7:
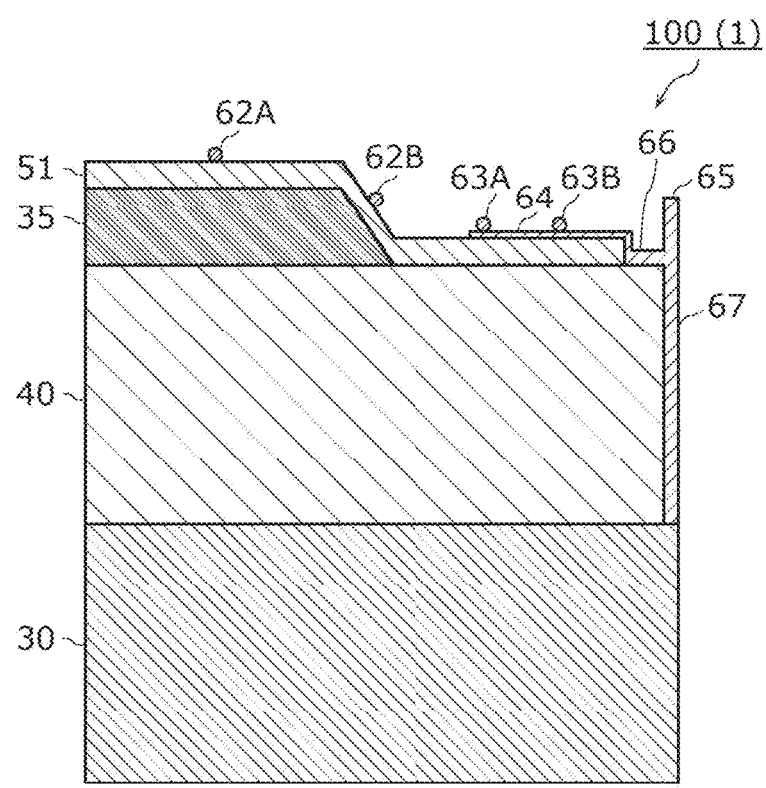
FIG. 7 is a schematic enlarged cross-sectional view of the semiconductor device according to Embodiment 1.

FIG. 7 is a schematic enlarged cross-sectional view of wafer 100 cut by being irradiated with a laser beam, that is, semiconductor device 1 separated by the first chip singulation method. FIG. 7 illustrates a state in which formations (hereinafter, referred to as "debris") that contain metal included in metal layer 30 are formed by the above phenomenon.

In FIG. 7, debris 62 (debris 62A and debris 62B in FIG. 7) is adhering onto water-soluble protective layer 51 on the surface of protective layer 35, out of formations scattered by irradiation with a laser beam.

Debris 63 (debris 63A and debris 63B in FIG. 7) is adhering onto water-soluble protective layer 51 on the surface of semiconductor layer 40, out of formations scattered by irradiation with a laser beam.

Debris 64 is like a film resulting from formations that are adhering onto water-soluble protective layer 51 on the surface of semiconductor layer 40 being contiguous and deposited, out of formations scattered by irradiation with a laser beam.

Debris 65 is formed by metal, which has once been liquefied or vaporized due to heat from irradiation with a laser beam, being stretched by suction air generated by the air being sucked from above and extending upward along the cut surface, and then cooled and hardened. The length of the extension of metal in the eighth process is at most 10 µm.

Debris 66 is formed by metal, which has once been liquefied or vaporized due to heat from irradiation with a laser beam, extending toward the surface of protective layer 35 and being cooled and hardened in a region in which water-soluble protective layer 51 is eliminated by irradiation with a laser beam. The length of the extension of metal in the eighth process is shorter than 5 µm. Accordingly, semiconductor device 1 separated by the first chip singulation method does not have debris 66 in a region located at least 5 µm inward from the outer edge of semiconductor layer 40 in the plan view of semiconductor layer 40.

Debris 67 is formed by metal, which has once been liquefied or vaporized due to heat from irradiation with a laser beam, being cooled and hardened on the side surface of semiconductor layer 40 and the side of metal layer 30.

Figure 3J:
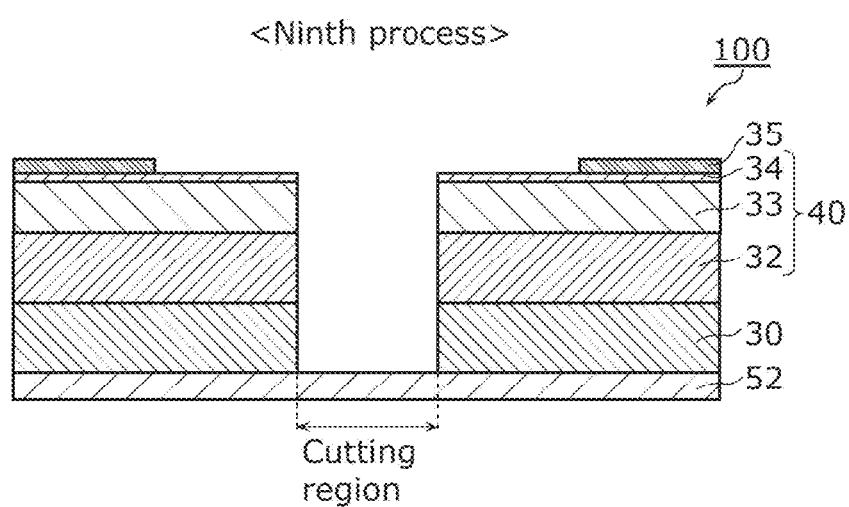
FIG. 3J is a schematic enlarged cross-sectional view of the wafer in Embodiment 1.

As illustrated in FIG. 3J, the ninth process is a process of removing water-soluble protective layer 51 from the surface of wafer 100, using wash water. Debris adhering onto water-soluble protective layer 51 is removed from the surface of wafer 100, together with water-soluble protective layer 51 in the ninth process.

The ninth process is performed by emitting a jet of wash water having a predetermined water pressure onto the upper surface of rotating wafer 100.

The inventors have repeatedly and diligently conducted experiments and examinations regarding a method of effectively removing water-soluble protective layer 51 and also debris together with water-soluble protective layer 51 in the ninth process.

As a result, the inventors have found that debris can be effectively removed together with water-soluble protective layer 51, if the ninth process includes, in the stated order, a first washing process in which wash water having a first water pressure is used and a second washing process in which wash water having a second water pressure is used, the first water pressure is at least 50 bar, and is higher than the second water pressure, and a time for the first washing process ranges from at least 40 seconds to at most 100 seconds.

The inventors have further repeatedly and diligently conducted experiments and examinations and found that debris can be further effectively removed together with water-soluble protective layer 51, if wafer 100 is rotated at a first rotational speed in the first washing process, wafer 100 is rotated at a second rotational speed lower than or equal to the first rotational speed in the second washing process, and a drying process of rotating wafer 100 at a third rotational speed higher than the first rotational speed is performed between the first washing process and the second washing process.

Figure 8A:
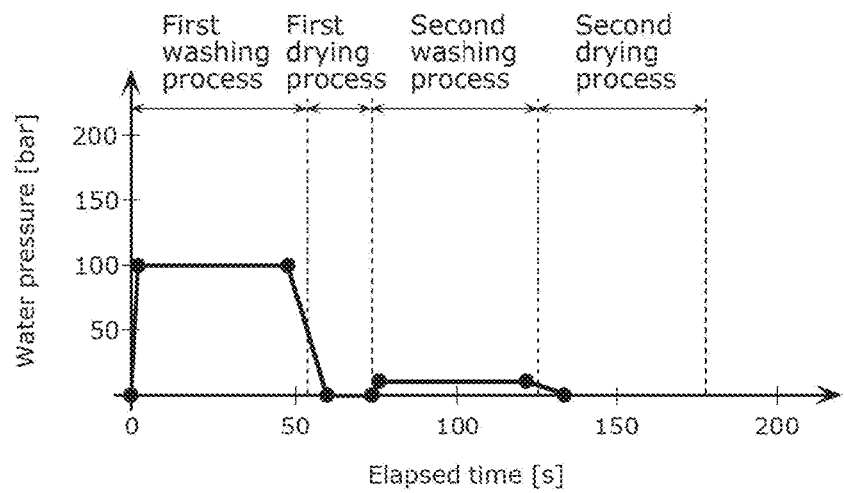
FIG. 8A is a graph illustrating a relation between the water pressure of wash water in Embodiment 1 and the elapsed time.
Figure 8B:
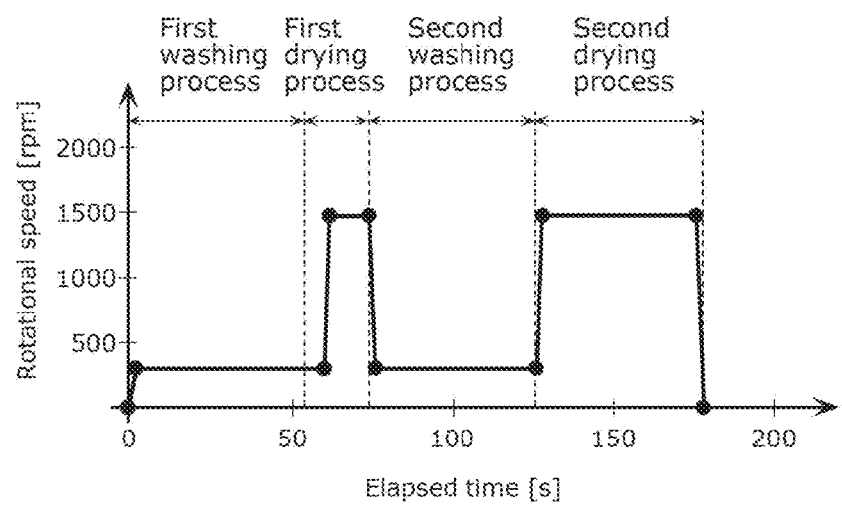
FIG. 8B is a graph illustrating a relation between the rotational speed of the wafer in Embodiment 1 and the elapsed time.

FIG. 8A is a graph illustrating a relation between the water pressure of wash water and the elapsed time in the ninth process, and FIG. 8B is a graph illustrating a relation between the rotational speed of wafer 100 and the elapsed time in the ninth process.

As illustrated in FIG. 8A and FIG. 8B, the ninth process includes the first washing process, the second washing process, a first drying process between the first washing process and the second washing process, and a second drying process after the second washing process.

The first water pressure in the first washing process is approximately 100 bar, and is higher than the second water pressure of lower than 30 bar in the second washing process. A time for the first washing process is approximately 55 seconds. The second rotational speed of wafer 100 in the second washing process is approximately 300 rpm, and is the same as approximately 300 rpm that is the first rotational speed of wafer 100 in the first washing process. Thus, the second rotational speed is at most the first rotational speed.

The first drying process is a process which is performed between the first washing process and the second washing process, and in which wafer 100 is rotated at a rotational speed of approximately 1500 rpm that is higher than the first rotational speed.

Figure 9:
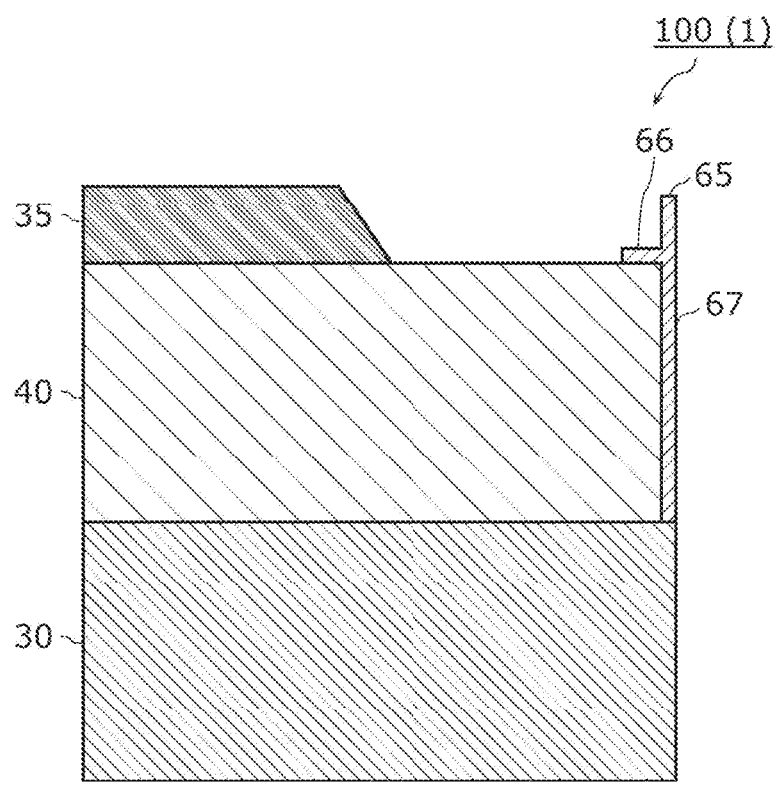
FIG. 9 is a schematic enlarged cross-sectional view of the semiconductor device according to Embodiment 1.

FIG. 9 is a schematic enlarged cross-sectional view of wafer 100, that is, semiconductor device 1 separated by the first chip singulation method when the ninth process ends.

As can be seen from a comparison between FIG. 7 and FIG. 9, debris 65, debris 66, and debris 67 are not removed and remain, yet debris 62, debris 63, and debris 64 are removed together with water-soluble protective layer 51 in the ninth process. Accordingly, in semiconductor device 1 separated by the first chip singulation method, an area occupancy of formations that contain metal included in metal layer 30 is at most 5% in a 10-µm square region located at least 5 µm inward from the outer edge of semiconductor layer 40 in the plan view of semiconductor layer 40.

As described above, the length of the extension of debris 65 that remains without being removed is at most 10 μm. Accordingly, in semiconductor device 1 separated by the first chip singulation method, the highest position of the formation physically connected to metal layer 30, that is, the highest position of debris 65 is at most 10 μm above the outer edge of semiconductor layer 40 in the plan view of semiconductor layer 40.

[1-3. Consideration]

Semiconductor device 1 is separated from wafer 100 by the first chip singulation method. Accordingly, as described above, in semiconductor device 1, an area occupancy of formations that contain metal included in the metal layer is at most 5% in a 10-μm square region located at least 5 μm inward from the outer edge of semiconductor layer 40 in the plan view of semiconductor layer 40.

Accordingly, adhesion of a formation that contains metal included in metal layer 30 is reduced in semiconductor device 1 separated by the first chip singulation method. Thus, the first chip singulation method provides semiconductor device 1 in which adhesion of a formation that contains metal included in metal layer 30 is reduced.

As described above, surface supporting layer 50 that remains without being completely removed from the surface of wafer 100 in the third process is removed in the sixth process. As a result, a mass concentration of carbon atoms on the uppermost surface of semiconductor device 1 out of the surfaces of semiconductor device 1 is lower than 18%. The mass concentration is lower than four times a carbon concentration on a side surface of metal layer 30 on which surface supporting layer 50 is not formed in the first chip singulation method.

Embodiment 2

The following describes a semiconductor device according to Embodiment 2 obtained by partially changing the configuration of semiconductor device 1 according to Embodiment 1.

[2-1. Structure of Semiconductor Device]

As described above, semiconductor device 1 according to Embodiment 1 is produced by being separated from wafer 100 by the first chip singulation method. In contrast, a semiconductor device according to Embodiment 2 is produced by being separated from wafer 100 by a second chip singulation method resulting from changing some of the processes of the first chip singulation method. Accordingly, the semiconductor device according to Embodiment 2 separated by the second chip singulation method differs from semiconductor device 1 in the shapes of semiconductor substrate 32, low-concentration impurity layer 33, and oxide film 34. Thus, semiconductor substrate 32 is referred to as semiconductor substrate 32A, low-concentration impurity layer 33 is referred to as low-concentration impurity layer 33A, and oxide film 34 is referred to as oxide film 34A in Embodiment 2. Along with this, semiconductor layer 40 is referred to as semiconductor layer 40A, and wafer 100 is referred to as wafer 100A. The semiconductor device according to Embodiment 2 is referred to as semiconductor device 1A.

[2-2. Chip Singulation Method of Separating Semiconductor Device]

The following describes the second chip singulation method for separating semiconductor device 1A from wafer 100A.

The second chip singulation method includes an eleventh process to a twentieth process in the order. Out of the processes, the eleventh process to a fifteenth process are equivalent to the first process to the fifth process, respectively, in the first chip singulation method in Embodiment 1, in which wafer 100 is replaced with wafer 100A, semiconductor substrate 32 is replaced with semiconductor substrate 32A, low-concentration impurity layer 33 is replaced with low-concentration impurity layer 33A, and oxide film 34 is replaced with oxide film 34A. Accordingly, description of the eleventh process to the fifteenth process is assumed to be already given and thus is omitted, and a sixteenth process to the twentieth process are to be described herein.

FIG. 10A to FIG. 10E are schematic enlarged cross-sectional views each illustrating a cutting region and therearound of wafer 100A in the sixteenth process to the twentieth process.

Figure 10A:
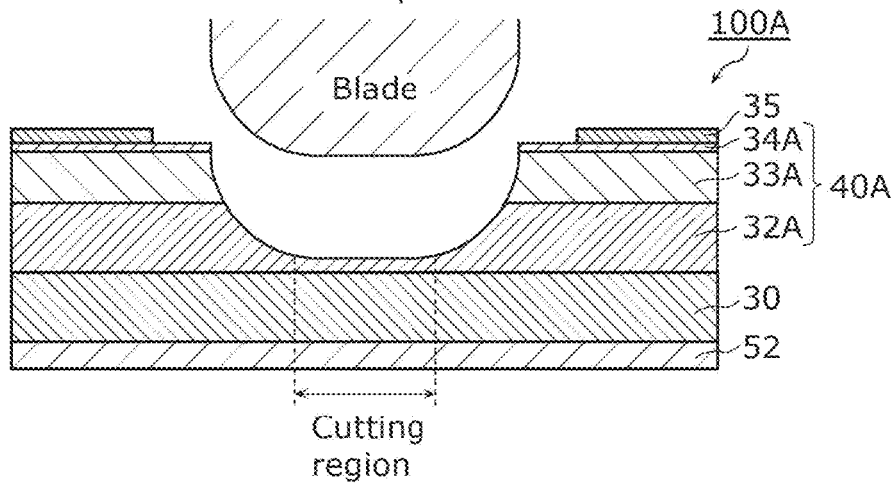
FIG. 10A is a schematic enlarged cross-sectional view of a wafer in Embodiment 2.

As illustrated in FIG. 10A, the sixteenth process is a process of forming a groove in the upper surface of wafer 100A in a region between adjacent ones of a plurality of semiconductor element structures. More specifically, the sixteenth process is a process of forming a groove in semiconductor layer 40A in a region between adjacent ones of a plurality of semiconductor element structures. As illustrated in FIG. 10A, the cutting region is included in an inner region of the groove.

The sixteenth process is performed by machining, using a dicing blade, on a region of the upper surface of wafer 100A where a groove is to be formed, for example. Note that FIG. 10A is a schematic diagram illustrating that a groove is formed by machining using a dicing blade, and thereafter the dicing blade is lifted up. The term "Blade" in FIG. 10A means the dicing blade.

Figure 10B:
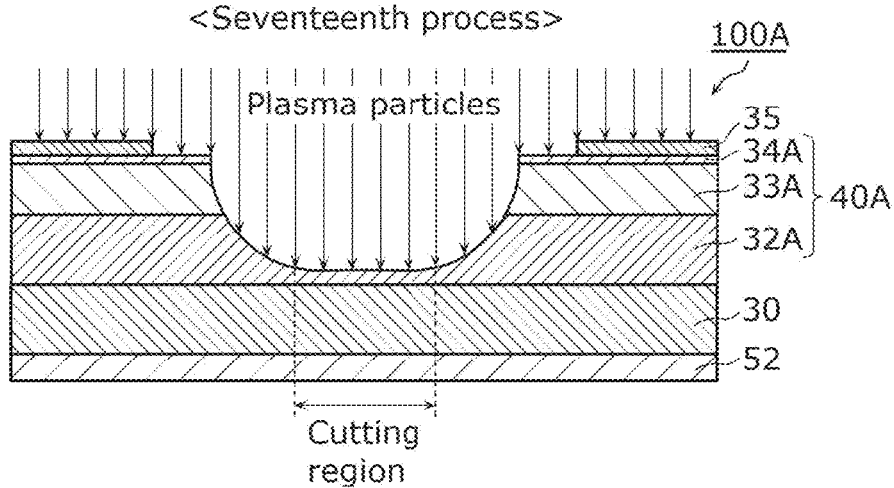
FIG. 10B is a schematic enlarged cross-sectional view of the wafer in Embodiment 2.

As illustrated in FIG. 10B, a seventeenth process is a process of increasing hydrophilicity of the surface of wafer 100A, which is performed on the upper surface of wafer 100A. The seventeenth process is similar to the sixth process in the first chip singulation method according to Embodiment 1.

As described above, a groove is formed in the upper surface of wafer 100A in the sixteenth process. Accordingly, the hydrophilicity of the surface of the groove is also increased in addition to the surface of oxide film 34A and the surface of protective layer 35 in the seventeenth process, as illustrated in FIG. 10B.

Figure 10C:
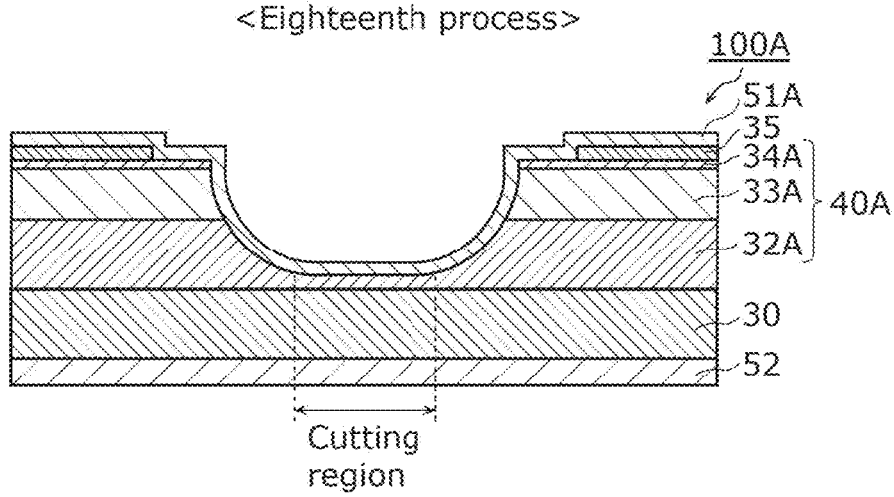
FIG. 10C is a schematic enlarged cross-sectional view of the wafer in Embodiment 2.

As illustrated in FIG. 10C, an eighteenth process is a process of forming, on the surface of wafer 100A, water-soluble protective layer 51A equivalent to water-soluble protective layer 51 in Embodiment 1. The eighteenth process is similar to the seventh process in the first chip singulation method according to Embodiment 1.

As described above, the hydrophilicity of the surface of the groove is also increased in addition to the surface of oxide film 34A and the surface of protective layer 35 in the seventeenth process. Accordingly, water-soluble protective layer 51A is also formed on the surface of the groove in addition to the surface of oxide film 34A and the surface of protective layer 35 in the eighteenth process, as illustrated in FIG. 10C.

Figure 10D:
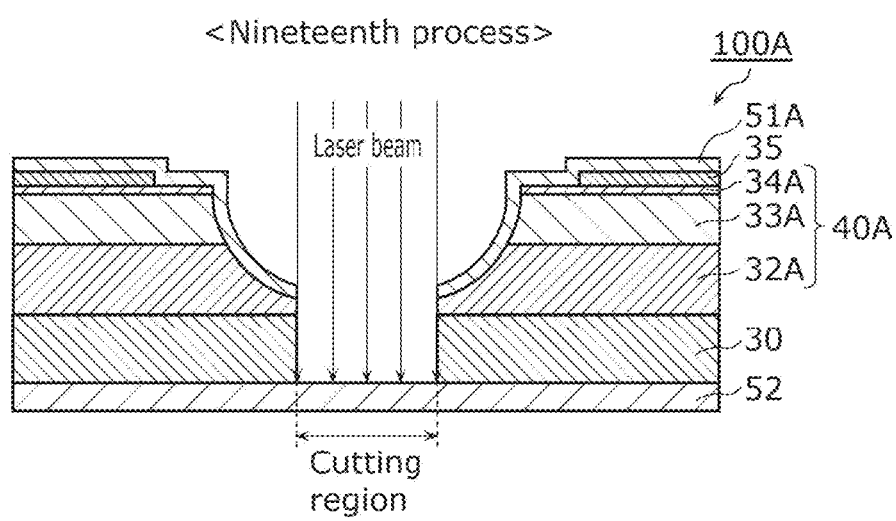
FIG. 10D is a schematic enlarged cross-sectional view of the wafer in Embodiment 2.

As illustrated in FIG. 10D, a nineteenth process is a process of cutting metal layer 30 by irradiating a cutting region that is a predetermined region of wafer 100A with a laser beam. The nineteenth process is similar to the eighth process in the first chip singulation method according to Embodiment 1.

As described above, the cutting region is included in an inner region of the groove. Accordingly, in semiconductor device 1A separated by the second chip singulation method, semiconductor layer 40A includes a curved step portion in a region extending inward of semiconductor layer 40A from the outer edge of semiconductor layer 40A, in a plan view of semiconductor layer 40A.

In the nineteenth process, in a plan view of wafer 100A, the distance between an edge of the cutting region and the outer edge of the uppermost surface of semiconductor layer 40A is at least 14 µm. Accordingly, in a plan view of semiconductor device 1A separated by the second chip singulation method, the distance between the outer edge of semiconductor device 1A and the outer edge of the uppermost surface of semiconductor layer 40A is at least 14 µm. At this time, Hp/Ls<1, where Hp denotes the height from the uppermost surface of semiconductor layer 40A to the uppermost surface of protective layer 35, and Ls denotes the length from the outer edge of the uppermost surface of semiconductor layer 40A to the outer edge of the lowermost surface of protective layer 35 in the plan view of wafer 100A, that is, in the plan view of semiconductor device 1A. Thus, Hp/Ls<1 in semiconductor device 1A separated by the second chip singulation method.

Similarly to the eighth process, in the nineteenth process, when metal layer 30 is cut by being irradiated with a laser beam, a phenomenon that formations that contain metal included in metal layer 30 are scattered, and a phenomenon that a formation is formed by metal that once liquefied or vaporized due to heat from irradiation with a laser beam being cooled again and hardened.

Figure 11:
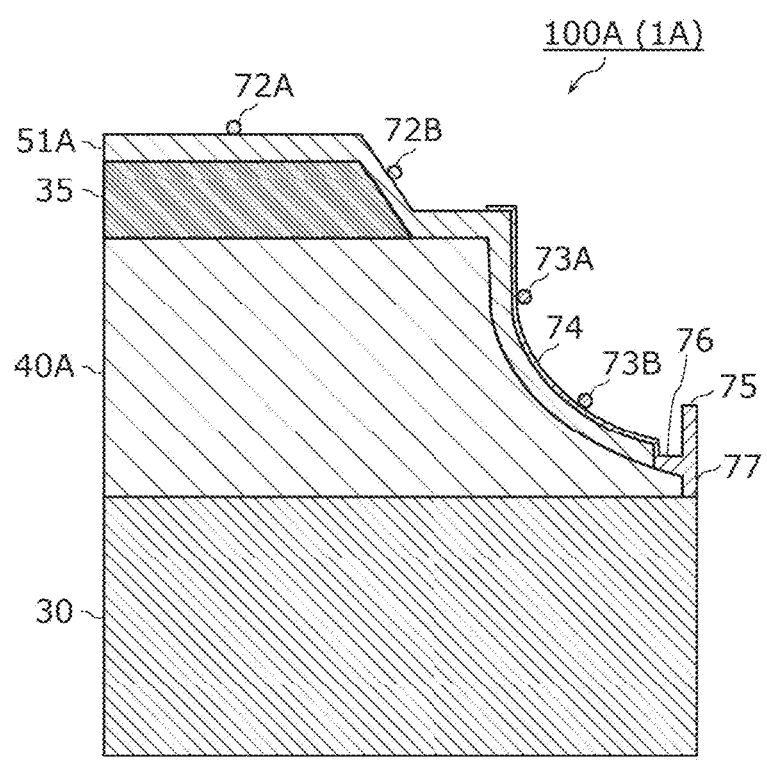
FIG. 11 is a schematic enlarged cross-sectional view of a semiconductor device according to Embodiment 2.

FIG. 11 is a schematic enlarged cross-sectional view of wafer 100A cut by irradiation with a laser beam, that is, semiconductor device 1A separated by the second chip singulation method. FIG. 11 illustrates a state in which debris is formed due to the above phenomena.

In FIG. 11, debris 72 (debris 72A and debris 72B in FIG. 11) is adhering onto water-soluble protective layer 51A on the surface of protective layer 35, out of formations scattered by irradiation with a laser beam.

Debris 73 (debris 73A and debris 73B in FIG. 11) is adhering onto water-soluble protective layer 51A on the surface of the curved step portion, out of formations scattered by irradiation with a laser beam.

Debris 74 is like a film resulting from formations that are adhering onto water-soluble protective layer 51A on the surface of the curved step portion being contiguous and deposited, out of formations scattered by irradiation with a laser beam.

Debris 75 is formed by metal, which has once been liquefied or vaporized due to heat from irradiation with a laser beam, being stretched by suction air generated by the air being sucked from above and extending upward along the cut surface, and then cooled and hardened. The length of the extension of metal in the nineteenth process is at most 10 µm.

Debris 76 is formed by metal, which has once been liquefied or vaporized due to heat from irradiation with a laser beam, extending toward the surface of the curved step portion and being cooled and hardened in a region in which water-soluble protective layer 51A is eliminated by irradiation with a laser beam. The length of the extension of metal in the sixteenth process is shorter than 13 µm. Accordingly, semiconductor device 1A separated by the second chip singulation method does not have debris 76 in a region located at least 13 µm inward from the outer edge of semiconductor layer 40A in a plan view of semiconductor layer 40A.

Debris 76 includes a portion in which the length of the extension of metal is shorter than 8 µm. Accordingly, semiconductor device 1A separated by the second chip singulation method does not have debris 76 in a region at least 8 µm and at most 13 µm apart from the outer edge of semiconductor layer 40A in the plan view of semiconductor layer 40A. This region corresponds to a region at a height of at least 5 µm and at most 10 µm above the outer edge of semiconductor layer 40A in the plan view of semiconductor layer 40A. Accordingly, stated differently, semiconductor device 1A separated by the second chip singulation method has a region that does not have debris 76 in a region of the surface of the curved step portion at a height of at least 5 µm and at most 10 µm above the outer edge of semiconductor layer 40A in the plan view of semiconductor layer 40A.

Debris 77 is formed by metal, which has once been liquefied or vaporized due to heat from irradiation with a laser beam, being cooled and hardened on the side surface of semiconductor layer 40A and the side of metal layer 30.

Figure 10E:
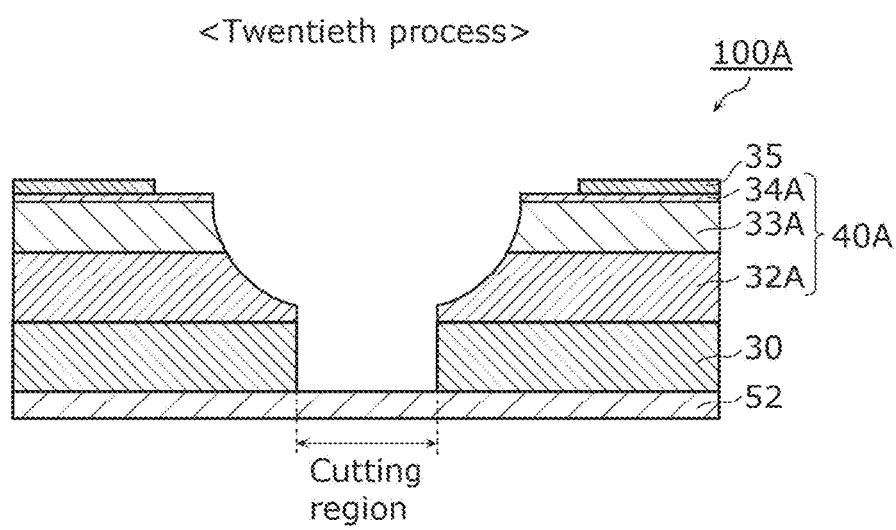
FIG. 10E is a schematic enlarged cross-sectional view of the wafer in Embodiment 2.

As illustrated in FIG. 10E, the twentieth process is a process of removing water-soluble protective layer 51A from the surface of wafer 100A using wash water. The twentieth process is similar to the ninth process in the first chip singulation method according to Embodiment 1.

Figure 12:
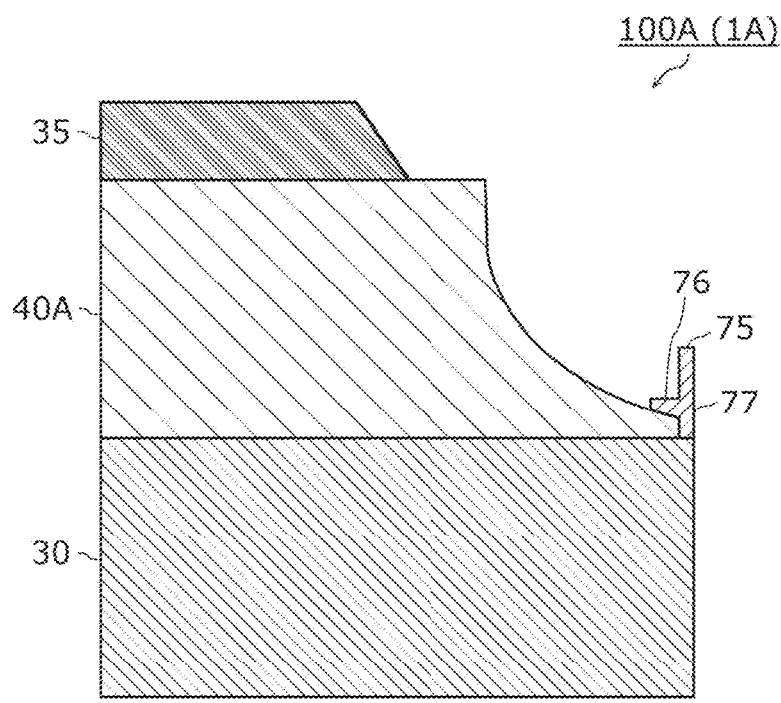
FIG. 12 is a schematic enlarged cross-sectional view of the semiconductor device according to Embodiment 2.

FIG. 12 is a schematic enlarged cross-sectional view of wafer 100A, that is, semiconductor device 1A separated by the second chip singulation method, when the twentieth process ends.

As can be seen from a comparison between FIG. 11 and FIG. 12, debris 75, debris 76, and debris 77 are not removed and remain, yet debris 72, debris 73, and debris 74 are removed together with water-soluble protective layer 51A trough the twentieth process. Accordingly, in semiconductor device 1A separated by the second chip singulation method, the area occupancy of formations that contain metal included in metal layer 30 is at most 5% in a 10-µm square region located at least 13 µm inward from the outer edge of semiconductor layer 40A in the plan view of semiconductor layer 40A. A region at least 8 µm and at most 13 µm apart from the outer edge of semiconductor layer 40A in the plan view of semiconductor layer 40A includes a 5-µm square region in which the area occupancy of formations that contain metal included in metal layer 30 is at most 5%. Stated differently, a region of the surface of the curved step portion at a height of at least 5 µm and at most 10 µm above the outer edge of semiconductor layer 40A in the plan view of semiconductor layer 40A includes a 5-µm square region in which the area occupancy of formations that contain metal included in metal layer 30 is at most 5%.

As described above, the length of the extension of debris 75 that remains without being removed is at most 10 µm. Accordingly, in semiconductor device 1A separated by the second chip singulation method, the highest position of the formation physically connected to metal layer 30, that is, the highest position of debris 75 is at most 10 µm above the outer edge of semiconductor layer 40A in the plan view of semiconductor layer 40A.

[2-3. Consideration]

Semiconductor device 1A is separated from wafer 100A by the second chip singulation method. Accordingly, as described above, in semiconductor device 1A, the area occupancy of formations that contain metal included in the metal layer is at most 5% in a 10-µm square region located at least 13 µm inward from the outer edge of semiconductor layer 40A in the plan view of semiconductor layer 40A.

Accordingly, in semiconductor device 1A separated by the second chip singulation method, adhesion of a formation that contains metal included in metal layer 30 is reduced. According to the second chip singulation method, semiconductor device 1A that reduces adhesion of a formation that contains metal included in metal layer 30 is provided.

(Supplement)

The above has described semiconductor devices and chip singulation methods according to aspects of the present disclosure, based on Embodiment 1 and Embodiment 2, yet the present disclosure is not limited thereto. The scope of one or more of the aspects also encompasses embodiments as a result of adding, to the embodiments, various modifications that may be conceived by those skilled in the art, and embodiments obtained by combining elements in different embodiments, as long as the resultant embodiments do not depart from the gist of the present disclosure.

Note that Embodiment 2 has described the sixteenth process as a process of forming a groove in semiconductor layer 40A in a region between adjacent ones of a plurality of semiconductor element structures, as illustrated in FIG. 10A. However, the sixteenth process is not necessarily limited to a process of forming a groove only in semiconductor layer 40A. The sixteenth process may be a process of forming a groove also in a portion of metal layer 30, in addition to semiconductor layer 40A, for example.

Figure 13:
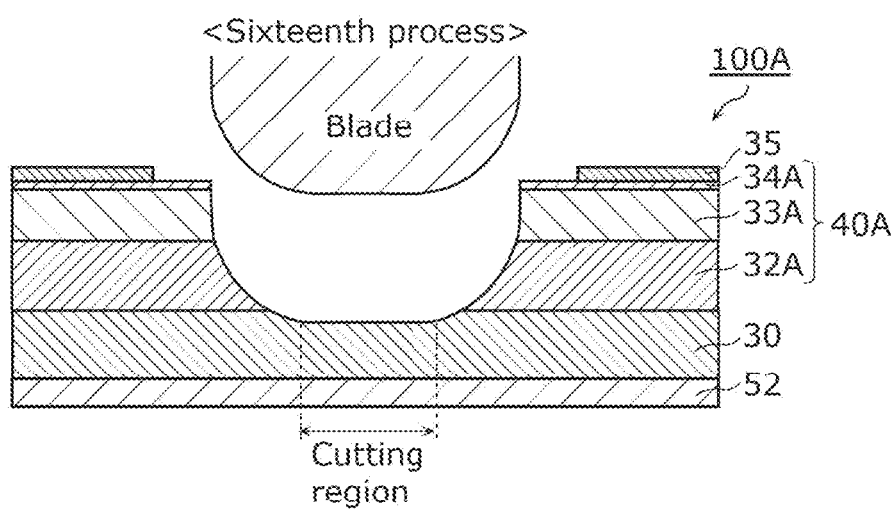
FIG. 13 is a schematic enlarged cross-sectional view of a wafer in a variation.

FIG. 13 is a schematic enlarged cross-sectional view of a cutting region and therearound of wafer 100A, in the sixteenth process when a groove is formed also in a portion of metal layer 30 in addition to semiconductor layer 40A. Note that FIG. 13 is a schematic diagram illustrating that a groove is formed by machining using a dicing blade, and thereafter the dicing blade is lifted up. The term "Blade" in FIG. 13 means the dicing blade.

Figure 14:
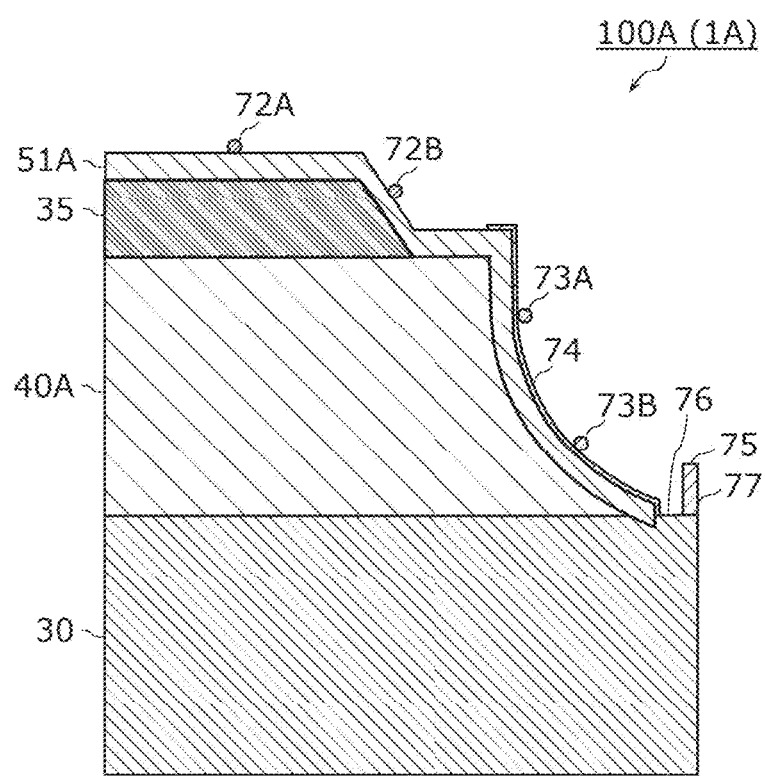
FIG. 14 is a schematic enlarged cross-sectional view of a semiconductor device according to the variation.

FIG. 14 illustrates a state in which debris is formed in the nineteenth process when a groove is formed also in a portion of metal layer 30 in addition to semiconductor layer 40A in the sixteenth process, and is a schematic enlarged cross-sectional view of wafer 100A cut by irradiation with a laser beam in the nineteenth process, that is, semiconductor device 1A separated by the second chip singulation method.

Figure 15:
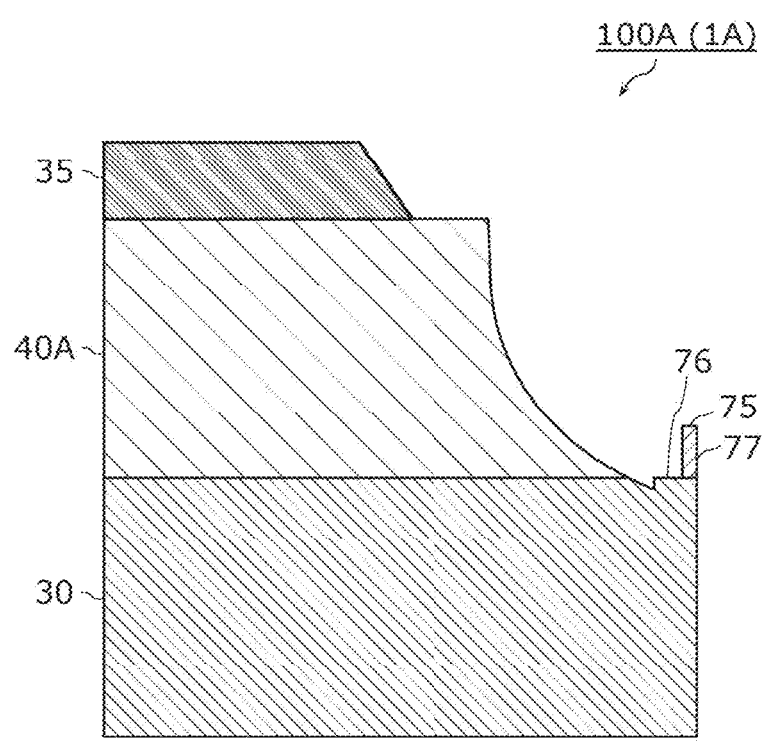
FIG. 15 is a schematic enlarged cross-sectional view of the semiconductor device according to the variation.

FIG. 15 illustrates when a groove is formed also in a portion of metal layer 30 in addition to semiconductor layer 40A in the sixteenth process, a schematic enlarged cross-sectional view of wafer 100A, that is, semiconductor device 1A separated by the second chip singulation method, when the twentieth process ends.

As is clear from a comparison between FIG. 11 and FIG. 12 and a comparison between FIG. 14 and FIG. 15, in the sixteenth process, also when a groove is further formed in a portion of metal layer 30 in addition to semiconductor layer 40A in the sixteenth process, in semiconductor device 1A separated by the second chip singulation method, the area occupancy of formations that contain metal included in metal layer 30 is at most 5% in a 10-μm square region located at least 13 μm inward from the outer edge of semiconductor layer 40A in the plan view of semiconductor layer 40A.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to, for instance, a semiconductor device in which a metal layer is formed at a bottom.

The invention claimed is:

1. A semiconductor device that is a chip-size-package-type semiconductor device that is facedown mountable, the semiconductor device comprising:
   a semiconductor layer that includes:
      a semiconductor substrate that contains an impurity of a first conductivity type; and
      a low-concentration impurity layer in contact with an upper surface of the semiconductor substrate, the low-concentration impurity layer containing an impurity of the first conductivity type having a concentration lower than a concentration of the impurity of the semiconductor substrate;
   a metal layer in contact with an entirety of an undersurface of the semiconductor substrate, the metal layer having a thickness of at least 10 μm;
   a first vertical metal-oxide semiconductor (MOS) transistor in a first region of the semiconductor layer;
   a second vertical MOS transistor in a second region of the semiconductor layer, the second region being adjacent to the first region in a plan view of the semiconductor layer; and
   a protective layer covering at least a portion of an upper surface of the semiconductor layer,
   wherein the semiconductor substrate functions as a common drain region for the first vertical MOS transistor and the second vertical MOS transistor,
   a side surface of the metal layer includes roughness that forms vertical stripes extending in a vertical direction that is a direction perpendicular to the metal layer, the roughness having a maximum height of profile greater than 1.0 μm, the maximum height of profile being measured in a lateral direction,
   in the plan view of the semiconductor layer, an area occupancy of a formation that contains metal included in the metal layer is at most 5% in a 10-μm square region located at least 13 μm inward from an outer edge of the semiconductor device, the 10-μm square region being included in the upper surface of the semiconductor layer,
   in the plan view of the semiconductor layer, the formation is present in a region that extends at most 13 μm inward from the outer edge of the semiconductor device,
   the formation covers a portion of the upper surface of the semiconductor layer in the plan view of the semiconductor layer,
   the formation includes a first portion that overlaps the semiconductor layer in a stack direction of the semiconductor layer, and a second portion that does not overlap the semiconductor layer in the stack direction of the semiconductor layer,
   the formation includes, in the second portion, a protrusion that protrudes upwards above the first portion in the stack direction of the semiconductor layer, and
   the formation is directly connected to the metal layer.

2. The semiconductor device according to claim 1, wherein in the plan view of the semiconductor device, a distance between the outer edge of the semiconductor device and an outer edge of an uppermost surface of the semiconductor layer is shorter than 14 μm, and
   in the plan view of the semiconductor device, the area occupancy of the formation is at most 5% in a 10-μm square region located at least 5 μm inward from the outer edge of the semiconductor device, the 10-μm square region being included in the upper surface of the semiconductor layer.

3. The semiconductor device according to claim 1,
wherein the semiconductor layer includes a curved step portion in a region extending inward of the semiconductor layer from an outer edge of the semiconductor layer, in the plan view of the semiconductor layer, and
the area occupancy of the formation is at most 5% in a 10-μm square region above a highest position of the formation, the 10-μm square region being included in a surface of the curved step portion, the formation being physically connected to the metal layer.

4. The semiconductor device according to claim 1,
wherein the semiconductor layer includes a curved step portion in a region extending inward of the semiconductor layer from an outer edge of the semiconductor layer, in the plan view of the semiconductor layer, and
in the plan view of the semiconductor device, a distance between the outer edge of the semiconductor device and an outer edge of an uppermost surface of the semiconductor layer is at least 14 μm.

5. The semiconductor device according to claim 1,
wherein in the plan view of the semiconductor device, in the upper surface of the semiconductor layer, a region at least 8 μm and at most 13 μm apart from the outer edge of the semiconductor device includes a 5-μm square region in which the area occupancy of the formation is at most 5%.

6. The semiconductor device according to claim 1,
wherein a highest position of the formation is at a height of at most 10 μm above an outer edge of the semiconductor layer in the plan view of the semiconductor layer, the formation being physically connected to the metal layer.

7. The semiconductor device according to claim 1,
wherein the semiconductor layer includes a curved step portion in a region extending inward of the semiconductor layer from an outer edge of the semiconductor layer, in the plan view of the semiconductor layer, and
in a surface of the curved step portion, a region at a height of at least 5 μm and at most 10 μm above the outer edge of the semiconductor layer in the plan view of the semiconductor layer includes a 5-μm square region in which the area occupancy of the formation is at most 5%.

8. The semiconductor device according to claim 1,
wherein a mass concentration of carbon atoms on an uppermost surface of the semiconductor device out of surfaces of the semiconductor device is lower than 18%.

9. The semiconductor device according to claim 1,
wherein a mass concentration of carbon atoms on an uppermost surface of the semiconductor device out of surfaces of the semiconductor device is lower than four times a mass concentration of carbon atoms on a side surface of the metal layer.

10. The semiconductor device according to claim 1,
wherein the semiconductor layer includes a curved step portion in a region extending inward of the semiconductor layer from an outer edge of the semiconductor layer, in the plan view of the semiconductor layer, and
a mass concentration of carbon atoms on a surface of the curved step portion is lower than 18%.

11. The semiconductor device according to claim 1,
wherein the semiconductor layer includes a curved step portion in a region extending inward of the semiconductor layer from an outer edge of the semiconductor layer, in the plan view of the semiconductor layer, and
a mass concentration of carbon atoms on a surface of the curved step portion is lower than four times a mass concentration of carbon atoms on the side surface of the metal layer.

12. The semiconductor device according to claim 1,
wherein the maximum height of profile of the roughness measured in the lateral direction is at most a maximum height of profile of roughness on an undersurface of the metal layer measured in a direction parallel to the undersurface of the metal layer.

13. The semiconductor device according to claim 1,
wherein Hp/Ls<1, where Hp denotes a height from an uppermost surface of the semiconductor layer to an uppermost surface of the protective layer, and Ls denotes a length from an outer edge of an uppermost surface of the semiconductor layer to an outer edge of a lowermost surface of the protective layer in the plan view of the semiconductor device.

\* \* \* \* \*